(12) United States Patent
Nishimura

(10) Patent No.: US 6,240,013 B1
(45) Date of Patent: May 29, 2001

(54) DATA HOLDING APPARATUS

(75) Inventor: Kyoshi Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/527,113

(22) Filed: Mar. 16, 2000

(30) Foreign Application Priority Data

Mar. 17, 1999 (JP) .................................................. 11-071733
Oct. 21, 1999 (JP) .................................................. 11-300289

(51) Int. Cl.[7] ...................................................... G11C 7/00
(52) U.S. Cl. .............................. 365/185.07; 365/185.01; 365/145
(58) Field of Search .............................. 365/145, 189.01, 365/185.01, 185.07

(56) References Cited
U.S. PATENT DOCUMENTS 5,218,569 * 6/1993 Banks .............................. 365/189.01

* cited by examiner

Primary Examiner—Terrell W. Fears
(74) Attorney, Agent, or Firm—Hogan & Hartson, LLP

(57) ABSTRACT

A data holding apparatus that is capable of a high speed response and that holds data even when the power source is off. Each memory cell of the data holding apparatus includes first and second transistors, where at least the first transistor is a ferroelectric transistor having a floating gate over the gate insulating film, and a ferroelectric layer between the gate insulating layer and the control gate. The control gate of the first transistor is connected to the drain of the second transistor and the control gate of the second transistor is connected to the drain of the first transistor to provide a positive feedback to each other, and the memory cell holds data defined by the ON or OFF states of the first and second transistors. The memory cell further includes data lines carrying data signals to be written into or read from the memory cell. When writing data, the data lines are connected to the floating gate of the first transistor and disconnected from the drains of the first and second transistors, and when reading data, the data lines are connected to the drains of the first and second transistors and disconnected from the floating gate of the first transistor.

16 Claims, 30 Drawing Sheets

Fig. 3
A
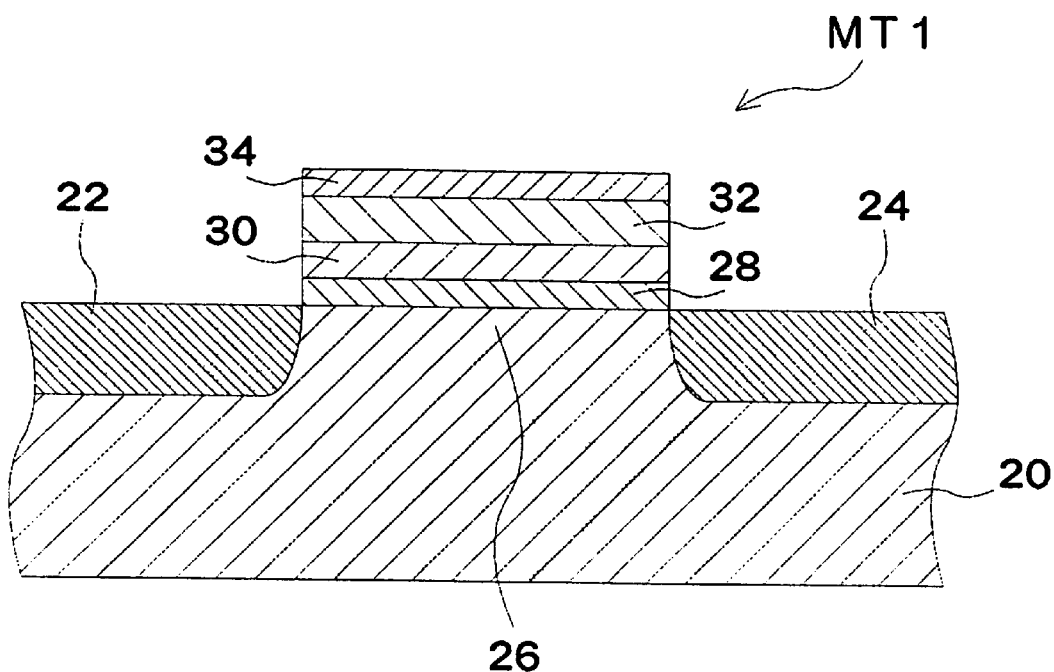
B
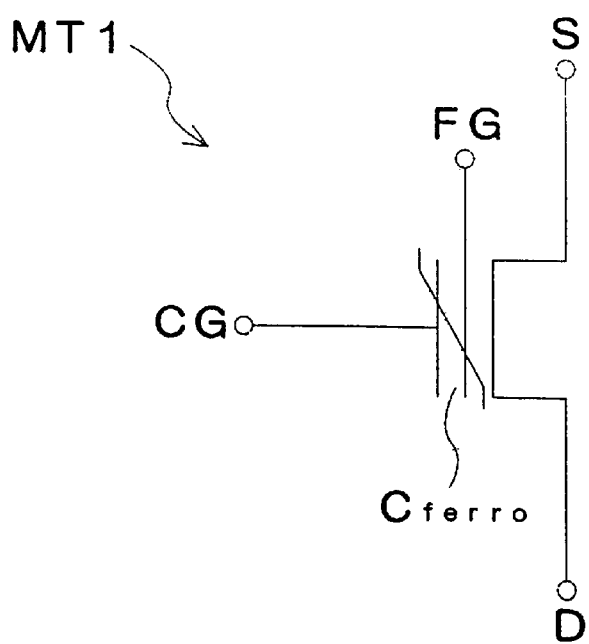

Data '1' retention state (standby)

Data '0' write operation (transient state)

Data '0' write operation (stable state)

Data 'O' retention state (standby)

Data '1' write operation

Fig.9 Data '1' read operation

Data '1' retention state (standby)

Data '0' write operation (first step)

Data '0' write operation (second step)

Data '0' retention state (standby)

Data '1' write operation

Data '1' read operation

DATA HOLDING APPARATUS

BACKGROUND OF THE INVENTION

1. Field of the Invention

This invention relates to a data holding apparatus that is capable of a high speed response and that does not require a use of a power source to hold data.

2. Description of the Related Art

SRAM (Static Random Access Memory) using MOSFET type transistors is known as a data holding apparatus. FIG. 30 is a circuit diagram of an example of a memory cell comprising a conventional SRAM. A memory cell MC is equipped with a pair of memory transistors MT1 and MT2 and a pair of resistors R1 and R2. Additionally, the memory cell MC is connected to a pair of select transistors ST1 and ST2 (in combination defined as a "a select transistor pair STP") by a pair of bit lines BL and BLB1 (in combination defined as a "bit line pair BLP"). The select transistor pair STP is connected to word lines WL. A number of such memory cells are placed in an array in a SRAM.

To write data in the memory cell MC of a SRAM, a pair of electric potentials that corresponds to data to be written is applied to the bit line pair BLP. To write Data "0", for example, a low electric potential "L" is applied to the bit line BL while a high electric potential "H" is applied to the bit line BLB. Next, the "H" electric potential is applied to word lines WL to turn ON the select transistor pair STP. This results in the memory transistor MT1 to go ON and the memory transistor MT2 to go OFF. Now, Data "0" is written in the memory cell MC. To write Data "1" in the memory cell MC, the high electric potential "H" is applied to the bit line BL and the low electric potential "L" is applied to the bit line BLB.

Subsequently changing the electric potential of the word lines WL to "L" turns the select transistor pair STP OFF and the memory cell goes into a standby state. In the standby state, written data is retained in the memory cell MC because of its self-latching capability. To read data, the electric potential "H" is applied to the word lines WL to turn ON the select transistor pair STP and to detect the voltage that appears in the bit line pair BLP. The content of the data is thus read out.

However, the above described SRAM had several problems. Because a voltage had to be consistently applied to the circuit to hold data, a power source was constantly required even when no data was being written or read. Consequently, SRAM consumed and wasted an electric power. Moreover, there was an inconvenience that a stored data was lost whenever the power source failed for any reason including an accident.

One of the solutions to the above noted problems may be to use a non-volatile storage element EEPROM as a memory element. However, this is infeasible for a data holding apparatus that must respond at a high speed since EEPROM requires a long time to write data.

SUMMARY OF THE INVENTION

Accordingly, it is an objective of the present invention to provide a memory device that substantially obviates one or more of the problems due to limitations and disadvantages of the conventional data holding apparatus such as SRAM. It is another object of the present invention to provide a data holding apparatus that is capable of a high speed response and that does not require a use of a power source to hold data.

To achieve these and other advantages and in accordance with the purpose of the present invention, as embodied and broadly described, the present invention provides a data holding apparatus comprising memory cells. Each memory cell includes first and second transistors, where at least the first transistor is a ferroelectric transistor having a floating gate and a ferroelectric layer between the gate insulating layer and the control gate. Each of the first and second transistors applies a positive feedback to the other of the first and second transistors to maintain an ON or OFF state of the other transistor, and the memory cell holds data defined by the ON or OFF states of the first and second transistors.

By applying a voltage that corresponds to data to be written directly to the floating gate, the ferroelectric transistor is enabled to be in the ON or OFF state that corresponds to the data at the same speed and stability as a conventional transistor that without the floating gate and a ferroelectric layer. Therefore, data can be written into the memory elements at a very high speed and a very high stability. The voltage applied to the floating gate and the voltage of the control gate trigger the ferroelectric layer to be in a polarized state that corresponds to the ON or OFF state of the subject ferroelectric transistor. Moreover, because the voltage is applied directly to both terminals of the ferroelectric layer, the ferroelectric layer can inverse its polarized state reliably and the power source voltage can be lowered effectively. Furthermore, the polarized state of the ferroelectric layer is maintained even when the power source of circuits is cut off. When the power source is turned back on, the ferroelectric transistor returns to the ON or OFF state that corresponds to the polarized state maintained by its ferroelectric layer. Consequently, the power source is not needed to hold data.

The memory element according to one embodiment includes first and second transistors where at least one of them is a ferroelectric transistor. The control gate of the first transistor is connected to the drain the second transistor and the control gate of the second transistor is connected to the drain of the first transistor, so that the first and second transistors provide positive feedback to each other so the ON or OFF state of the transistors are different from each other. Moreover, the electric potential of a control gate of a ferroelectric transistor in a stationary state after data are written is almost the same as that of a floating gate when data are being written. As a result, electric potentials of both terminals of the ferroelectric transistor do not change even when the floating gate returns to a floating state at the completion of the write process.

The data holding apparatus according to a second embodiment is equipped with first and second power source supply lines and data lines for inputting and outputting data. The drain of the first and second transistors are connected to the first power source supply line by first and second pull-up resistors, respectively. The source of the first and second transistors are connected to the second power source supply line. When writing data, the data lines are connected to floating gates and disconnected from the drains. When reading data, data lines are connected to the drains, and disconnected from the floating gates. Consequently, a non-volatile memory unit that is capable of securely holding data can be constructed from a relatively few number of elements.

The data holding apparatus according to a third embodiment is similar to the second embodiment and both the first and second transistors are ferroelectric transistors. The data holding apparatus is equipped with data lines that obtain mutually different logical values defined as the first and second data lines. When writing data, the first and second data lines are connected to corresponding floating gates of the first and second transistors, and disconnected from the corresponding drains of the first and second transistors. When reading data, the first and second data lines are connected to the corresponding drains of the first and second transistors, and disconnected from the corresponding floating gates of the first and second transistors.

The data holding apparatus according to a fourth embodiment includes a first CMOS inverter equipped with the first and a third transistor, and a second inverter equipped with the second transistors and a fourth transistor. At least one of the first through fourth transistors is a ferroelectric transistor. The output terminal of the first CMOS inverter is connected to the input terminal of the second CMOS inverter, and the output terminal of the second CMOS inverter is connected to the input terminal of the first CMOS inverter to maintain mutually different output conditions by providing positive feedback to each other.

The data holding apparatus according to a fifth embodiment is similar to the fourth embodiment and equipped with data lines for inputting and outputting data. When writing data, the data lines are connected to the floating gates and disconnected from the output terminals. When reading data, the data lines are connected to the output terminals and disconnected from the floating gates.

The data holding apparatus according to a sixth embodiment is similar to the fifth embodiment and both the first and the second transistor are ferroelectric transistors. The data holding apparatus has first and second data lines that carry different logical values. When writing data, the first and second data lines are connected to corresponding floating gates of the first and second transistors, and disconnected from the corresponding output terminals of the first and second CMOS inverter. When reading data, the first and second data lines are connected to corresponding output terminals of the first and second CMOS inverters, and disconnected from the corresponding floating gates of the first and second transistors.

The data holding apparatus according to a seventh embodiment is similar to the sixth embodiment and the third and fourth transistors are also ferroelectric transistors. The first and second data lines are connected to the floating gates of the third and fourth transistors, respectively.

The data holding apparatus according to an eighth embodiment is similar to the fourth embodiment and includes input lines on the data input side and output lines on the data output side. When refreshing data, the input lines are connected to the floating gates, and when holding data, the input lines are disconnected from and floating gates. The output lines are connected with output terminals.

The data holding apparatus according to a ninth embodiment is similar to the eighth embodiment and both the first and third transistors are ferroelectric transistors. When refreshing data, the input line are connected to the corresponding floating gates of the first and third transistors, and when holding data, the input line are disconnected from the corresponding floating gates the first and third transistors. The output lines are connected to either the output terminal of the first CMOS inverter or that of the second CMOS inverter.

The data holding apparatus according to a tenth embodiment is similar to the ninth embodiment and both the second and fourth transistors are also ferroelectric transistors. The data holding apparatus has first and second input lines that are have mutually different logical values, and first and second output lines that have mutually different logical values. When refreshing data, the first input line is connected to the floating gates of the first and third transistors, and the second input line is connected to the floating gates of the second and fourth transistors. When holding data, the first input line is disconnected from the floating gates of the first and third transistors and the second input line is disconnected from the floating gates of the second and fourth transistors. The first and second output lines are connected to output terminals of the first and second CMOS inverters, respectively.

The data holding apparatus according to an eleventh embodiment has a pair of electric source supply lines that carries different electric potentials and a bus line. The sources and control gates of the first transistor is connected to one of the pair of electric source supply lines, the drain of the first transistor is connected to the bus line, and the floating gates of the first transistor is connected to the bus line via an inverter.

In the data holding apparatus according to a twelfth embodiment, the first transistor is a ferroelectric transistor. The control gate of the first transistor is directly connected to the drain of the second transistor and the control gate of the second transistor is connected to the drain of the first transistor via a switching element. When writing data, a voltage that corresponds to data to be written is directly applied to the floating gate of the first transistor, while the switching element remains OFF for a prescribed duration before turning on, so the data voltage is applied to the control gate of the second transistor with a delay.

The data holding apparatus according to a thirteenth embodiment is similar to the fourth embodiment and the first transistor is a ferroelectric transistor. The output terminal of the second CMOS inverter is directly connected to the input terminal of the first CMOS inverter and the output terminal of the first CMOS inverter is connected to the input terminal of the second CMOS inverter via a switching element. When writing data, a voltage that corresponds to data to be written is directly applied to the floating gate of the first transistor, while the switching element remains OFF for a prescribed duration before turning ON, so the data voltage is applied to the input terminal of the second CMOS inverter with a delay.

In both the twelfth and thirteenth embodiments, when writing data, applying the data voltage directly to the floating gate of the first transistor while maintaining the switching element in the OFF state for a prescribed duration ensures that the ferroelectric layer of the first transistor is in a polarized state corresponding to the data to be written. Subsequently changing the switching element to the ON state enables the second transistor to be in the ON or OFF state different from that of the first transistor. In other words, data can be written securely regardless of fluctuations in process to manufacture these transistors.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

FIG. 3A illustrates the structure of a memory transistor MT1.

FIG. 3B is a circuit diagram of the memory transistor MT1 of FIG. 3A.

DETAILED DESCRIPTION OF THE PREFERRED EMBODIMENTS

Figure 1:
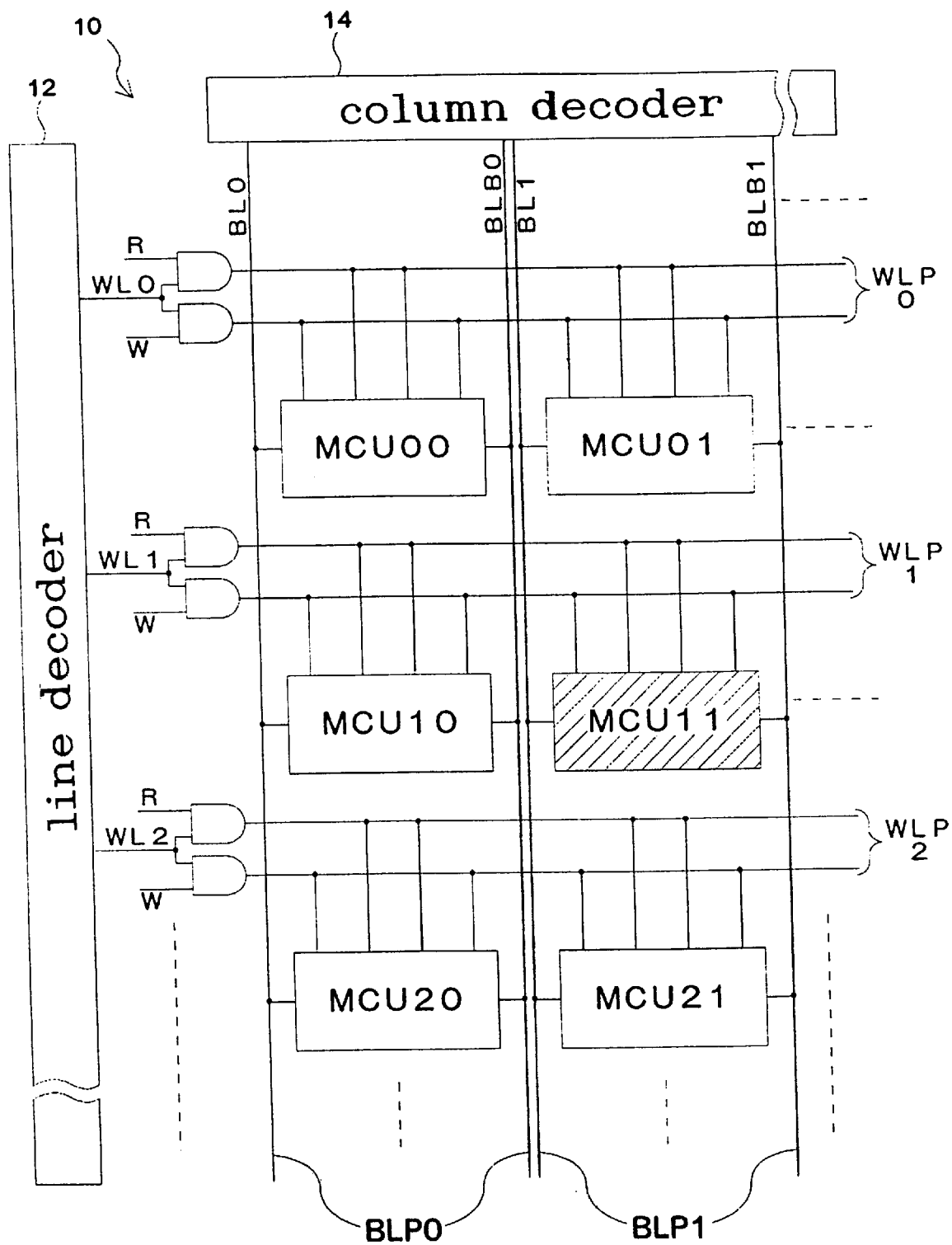
FIG. 1 illustrates a memory apparatus 10 in accordance with one embodiment of the present invention.

FIG. 1 illustrates a sample configuration of a memory apparatus 10, i.e., a data holding apparatus, in accordance with one embodiment of the present invention. Several memory cell units MCU00, MCU01, and so forth are placed in an array in the memory apparatus 10.

Figure 2:
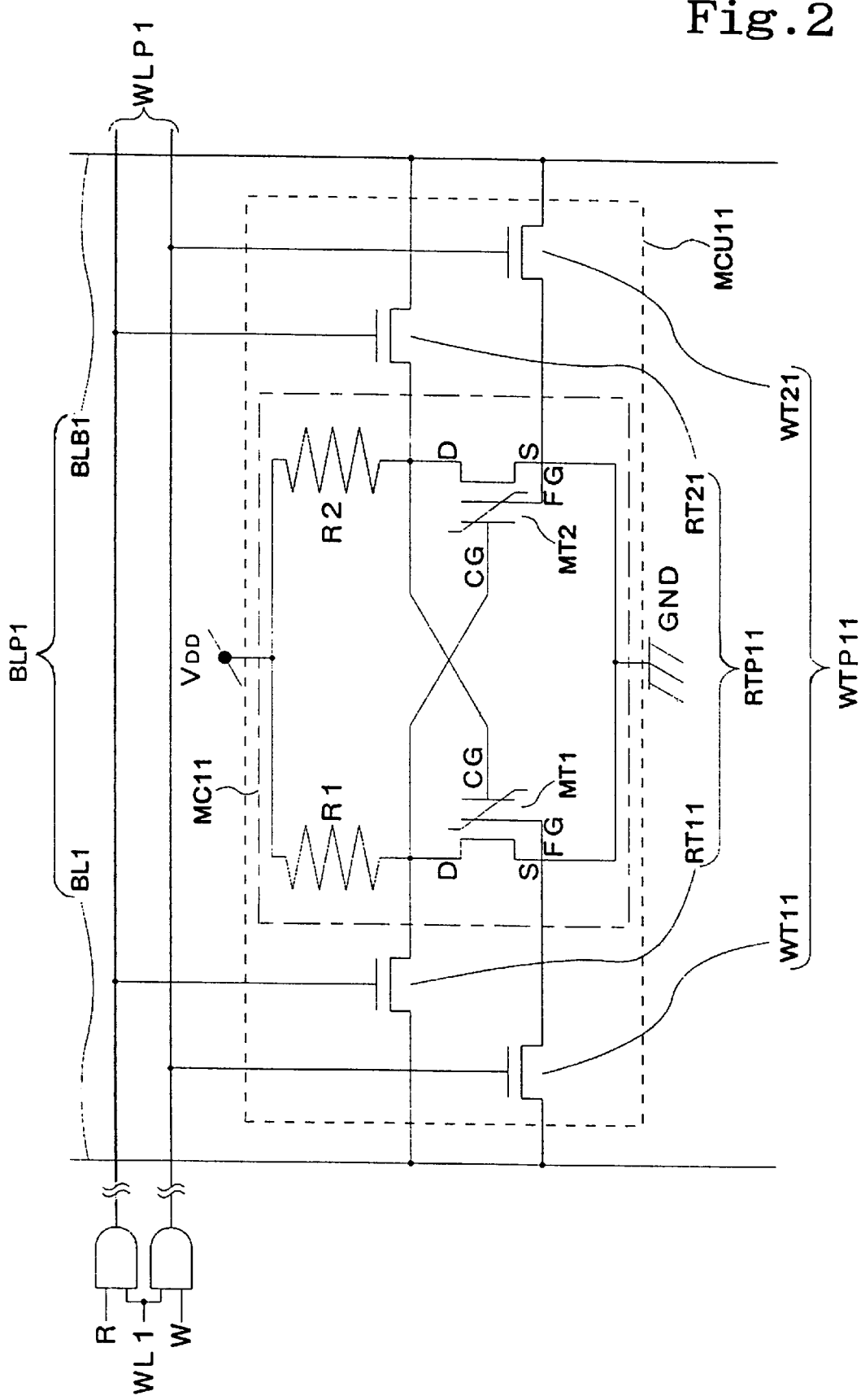
FIG. 2 shows a memory cell MC11 included in a memory cell unit MCU11 comprising the memory apparatus 10.

The memory cell units MCU00, MCU01, and so forth is explained using a memory cell unit MCU11 as an example. As shown in FIG. 2, the memory cell unit MCU11 comprises a memory cell MC11 which is a memory element, a read select transistor pair RTP11, and a write select transistor pair WTP11 which is explained below. In other words, the memory cell MC11 is connected to an intersection of a word line pair WLP1 and a bit line pair BLP1 to be explained below by the read select transistor pair RTP11 and the write select transistor pair WTP1. The composition of other memory units MCU00, MCU01, and so forth is the same as that of the memory cell unit MCU11 explained above. As shown in FIG. 1, each word line pair WLP0, WLP1, WLP2, and so forth is a pair of signal lines wherein each of word lines WL0, WL1, WL2, and so forth is ANDed with a read control line R to give one line of signals and the word lines WL0, WL1, WL2, and so forth is ANDed with a write control line W to give the other line of signals. All word lines WL0, WL1, WL2, and so forth are connected to a line decoder 12 while bit line pairs BLP0, BLP1, and so forth are connected to a column decoder 14. In other words, when the line decoder 12 selects one word line (the word line WL1 for example) and the column decoder 14 selects one bit line pair (BLP1 for example), one memory cell (MC11) is selected by one read select transistor pair (RTP11) to read data as shown in FIG. 2. To write data, one memory cell (MC11) is selected by one write select transistor pair (WTP11).

Specific circuits of the memory cell MC11 included in the memory cell unit MCU11 is explained with reference to FIG. 2. The memory cell MC11 comprises a memory transistor MT1 defined as the first transistor, a memory transistor MT2 defined as the second transistor, a resistor R1 defined as the first pull-up resistor, and a resistor R2 defined as the second pull-up resistor. These components of the memory cell MC11 are connected as shown in FIG. 2. The memory cell is configured in a manner in which a control gate electrode CG of the memory transistor MT1 is connected to a drain electrode D of the memory transistor MT2 while the control gate electrode CG of the memory transistor MT2 is connected to the drain electrode D of the memory transistor MT1. Accordingly, each transistor gives the other a positive feedback, and the two transistors are maintained in ON or OFF states opposite to each other.

Figure 30:
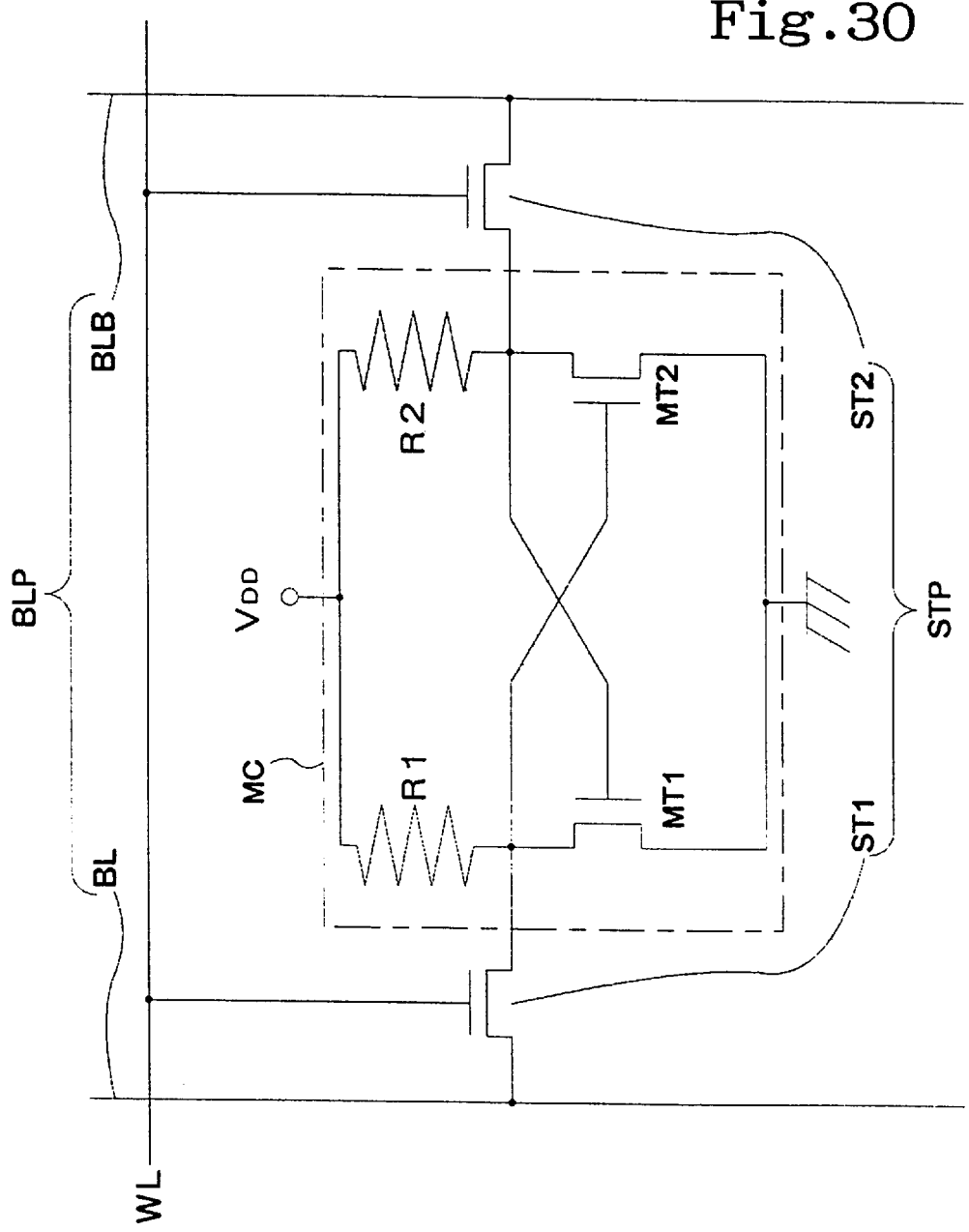
FIG. 30 illustrates a memory cell MC for a conventional memory apparatus.

Memory transistors MT1 and MT2 are so-called MFMIS structured ferroelectric transistors (a transistor structured by laminating with metal at the top followed by ferroelectric materials, metal, insulation materials, and silicon). In other words, the memory cell MC11 employs a pair of MFMIS structured transistors instead of a pair of memory transistors MT1 and MT2 as in the conventional SRAM (Static Random Access Memory—refer to FIG. 30).

The structure of the memory transistor MT1 is shown in FIG. 3A. A source area 22 and a drain area 24 of an n-type semiconductor (the first semiconductor type) are formed on a p-type silicon base 20, a semiconductor base. A gate insulating film 28 comprised of silicon oxide ($SiO_2$) is provided over a channel forming area 26 of a p-type semiconductor (the second semiconductor type). A floating gate 30 laminated with Poly-Si at the top followed by $IrO_2$ and Ir is provided over the gate insulating film 28. A ferroelectric layer 32 comprising PZT is provided over the floating gate 30. The ferroelectric layer 32 maintains a polarized state that corresponds to an ON or OFF state of the memory transistor MT1 which will be explained below. Additionally, a control gate 34 laminated with $IrO_2$ at the top followed by Ir is provided over the ferroelectric layer 32. In addition to the above noted materials, silicon nitride (SiN) can be used for a gate insulating film 28. Additionally, oxide conductors such as RuOx or ITO and metals such as Pt, Pb, Au, Ag, Al, and Ni can also be used for the floating gate 30 and the control gate 34.

FIG. 3B is a circuit diagram of the memory transistor MT1 in FIG. 3A. A control gate electrode CG is connected to the control gate 34. A floating gate electrode FG is connected to the floating gate 30. A source electrode S is connected to the source area 22 and a drain electrode D is connected to the drain area 24.

Referring back to the memory cell MC11 in FIG. 2, the drain electrode D of the memory transistor MT1 and the drain electrode D of the memory transistor MT2 are connected by read select transistors RT11 and RT21 (these two transistors in combination are defined as the "read select transistor pair RTP11") to the bit line BL1 defined as the first data line and the BLB1 defined as the second data line, respectively. These two data lines in combination are defined as the "bit line pair BLP1". Gates of the read select transistor pair RTP11 are connected to one of the signal lines of the word line pair WLP1 that is an AND of the word line WL1 and the read control line R. The floating gate electrode FG of the memory transistor MT1 and the floating gate electrode FG of the memory transistor MT2 of the memory cell MC11 are connected by write select transistors WT11 and WT12 (the two transistors in combination are defined as the "read select transistor pair WTP11") to bit lines BL1 and BLB1, respectively. Gates of the write select transistor pair WTP11 are connected to one of the signal lines of the word line pair WLP1 that is an AND of the word line WL1 and the write control line W. Drain electrodes D of memory transistors MT1 and MT2 are connected to a power source line $V_{DD}$ (the power source electric potential $V_{DD}$) defined as the first power source supply line by resistors R1 and R2, respectively. Both source electrodes S are connected to a ground line GND (the ground electric potential) defined as the second power source supply line. All of the read select transistors RT11 and RT12 and the write select transistors WT11 and WT12 are regular n-channel MOSFET type transistors.

Although the memory cell MC11 included in the memory cell unit MCU11 has been used as an example to explain memory cells, all memory cells included in memory cell units MCU00, MCU01, and so forth are structured exactly the same as the memory cell MC11.

The operation of the memory cell MC11 included in the memory cell unit MCU11 shown in FIG. 2 is described below. To write data, the write select transistor pair WTP11 is turned ON to connect the bit lines BL1 and BLB1 to the respective floating gate electrodes FG of the memory transistors MT1 and MT2. Simultaneously, the read select transistor pair RTP11 turns OFF to cut off connections between the bit lines BL1 and BLB1 and the respective drain electrodes D of the memory transistors MT1 and MT2. On the other hand, to read data, the read select transistor pair RTP11 is turned ON to connect the bit lines BL1 and BLB1 to the respective drain electrodes D of the memory transistors MT1 and MT2, and the write select transistor pair WTP11 simultaneously turns OFF to cut off connections between the bit lines BL1 and BLB1 and the respective floating gate electrodes FG of the memory transistors MT1 and MT2.

Figure 4:
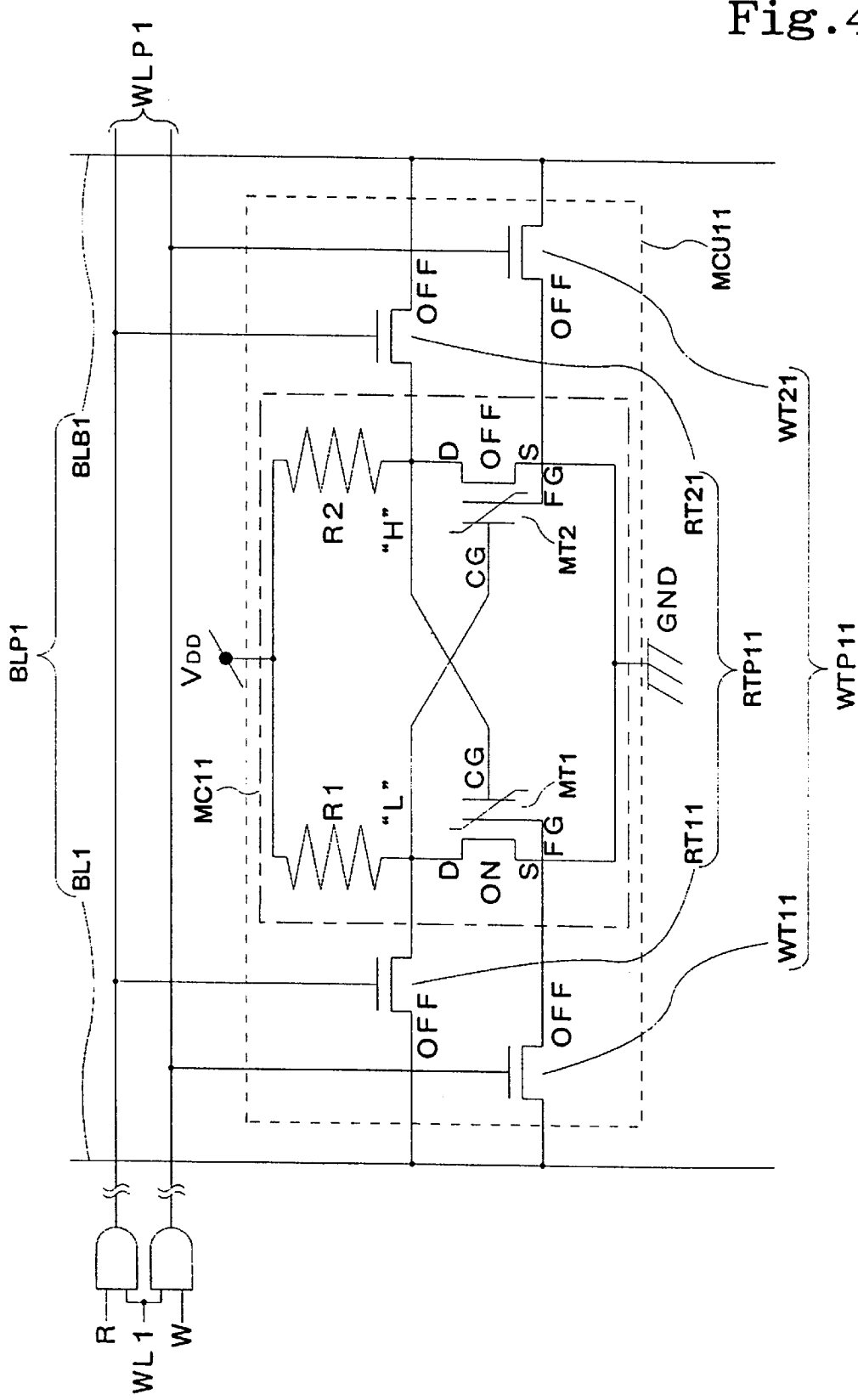
FIG. 4 illustrates a memory cell MC11 holding data "1" in a standby state.

The read and write operations are detailed below. First, the operation of writing data in the memory cell MC11 included in the memory cell unit MCU11 of the memory apparatus 10 shown in FIG. 1 will be explained below. Assuming here that Data "1" is already stored in the memory cell MC11 before this write data operation starts, the operation to write Data "0" in the memory cell MC11 is explained with reference to FIG. 4 through FIG. 7. FIG. 4 explains the state of the memory cell MC11 during a standby period (before the write operation starts). The standby period is defined as the state when the memory cell is not accessed. Specifically, it is the state when no write or read operation is in progress. In FIG. 4, the read select transistor pair RTP11 and the write select transistor pair WTP11 are both OFF while the memory transistor MT1 is ON and the memory transistor MT2 is OFF. This state shows that Data "1" is stored.

Figure 5:
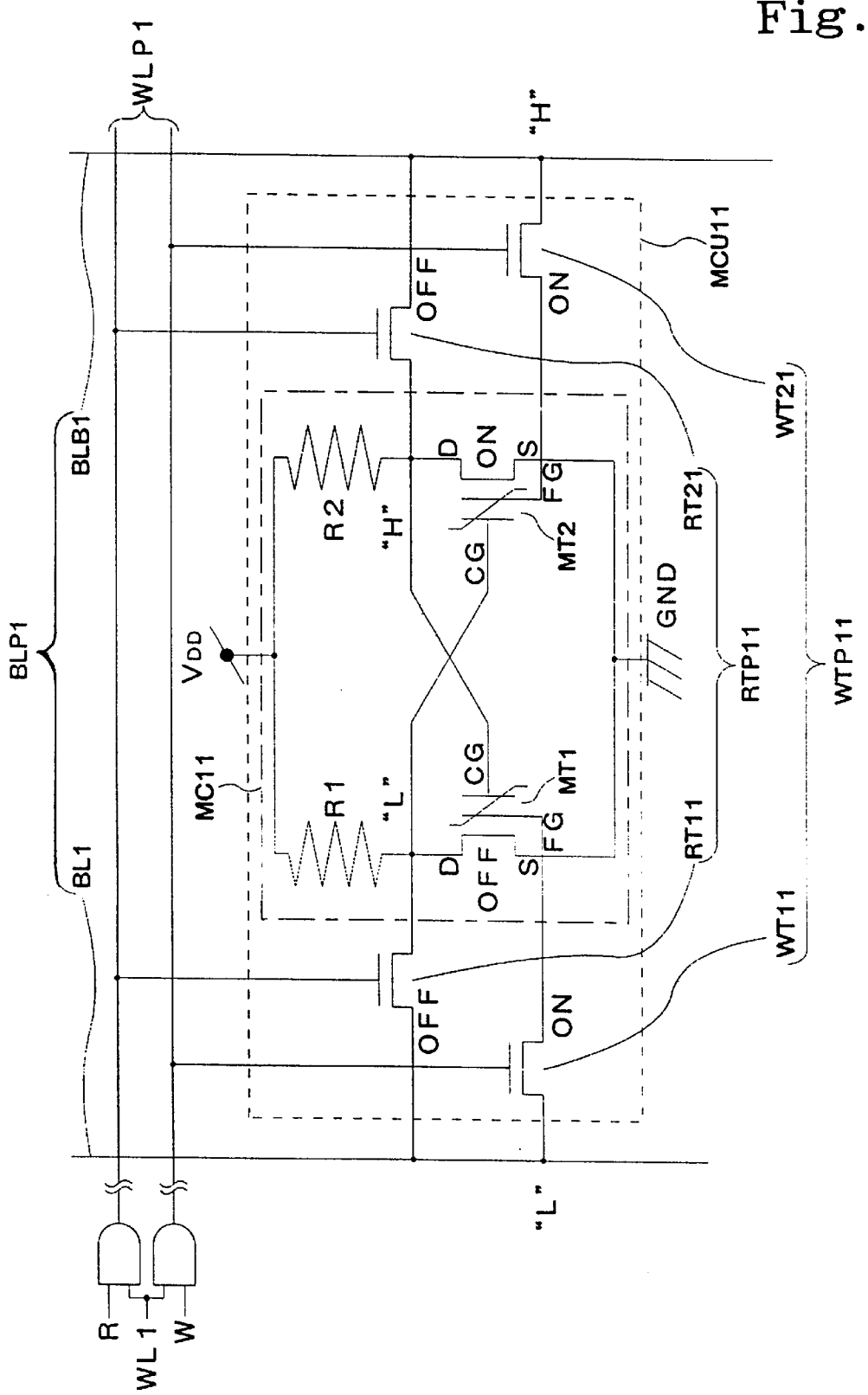
FIG. 5 illustrates a transient state during writing of Data "0" into the memory cell MC11.

To write Data "0" in the memory cell MC11 from this state, first the bit line pair BLP1 is selected by the column decoder 14 shown in FIG. 1 and the bit line pair BLP1 is applied with an electric potential that correspond to Data "0". In other words, the low electric potential "L" (the ground electric potential) is applied to the bit line BL1 of the bit line pair BLP1 and the high electric potential "H" (the power source electric potential $V_{DD}$) is applied to the bit line BLB1. (See FIG. 5.) Next, the word line WL1 is selected by the line decoder 12 and "H" in electric potential is applied to the word line WL1. Also "H" is applied to the write control line W. This cause the write select transistor pair WTP11 to go ON. Almost simultaneously as the write select transistor pair WTP11 goes ON, the electric potential of the floating gate electrode FG of the memory transistor MT1 in the memory cell MC11 becomes "L" as shown in FIG. 5. Because the threshold of the memory transistor MT1 is set for the memory transistor MT1 to go OFF (the interrupt state) when the electric potential of the floating gate electrode FG becomes "L", the memory transistor MT1 goes OFF almost simultaneously as the write select transistor pair WTP11 goes ON. On the other hand, the electric potential of the floating gate electrode FG of the memory transistor MT2 becomes "H" almost simultaneously as the write select transistor pair WTP11 goes ON. Because the threshold of the memory transistor MT2 is set for the memory transistor MT2 to go ON (the relay state) when the electric potential of the floating gate electrode FG becomes "H", the memory transistor MT2 goes ON almost simultaneously as the write select transistor pair WTP11 goes ON. In other words, the memory cell MC11 changes from the state shown in FIG. 4 (when Data "1" is stored) to the state shown in FIG. 5 (when Data "0" is stored) immediately when the write select transistor pair WTP11 goes ON. In short, a similar write speed as a regular SRAM can be obtained by applying voltages of the bit lines BL1 and BLB1 of the bit line pair BLP1 directly to the floating gate electrodes FG of the memory transistors MT1 and MT2, respectively.

Once the memory cell MC11 is reloaded with Data "0" as described above, the ferroelectric layers 32 (refer to FIG.

3A) of the memory transistors MT1 and MT2 change their respective polarized state. The ferroelectric layer 32 of the memory transistor MT1 is used as an example to explain the change in its polarized state.

Figure 10:
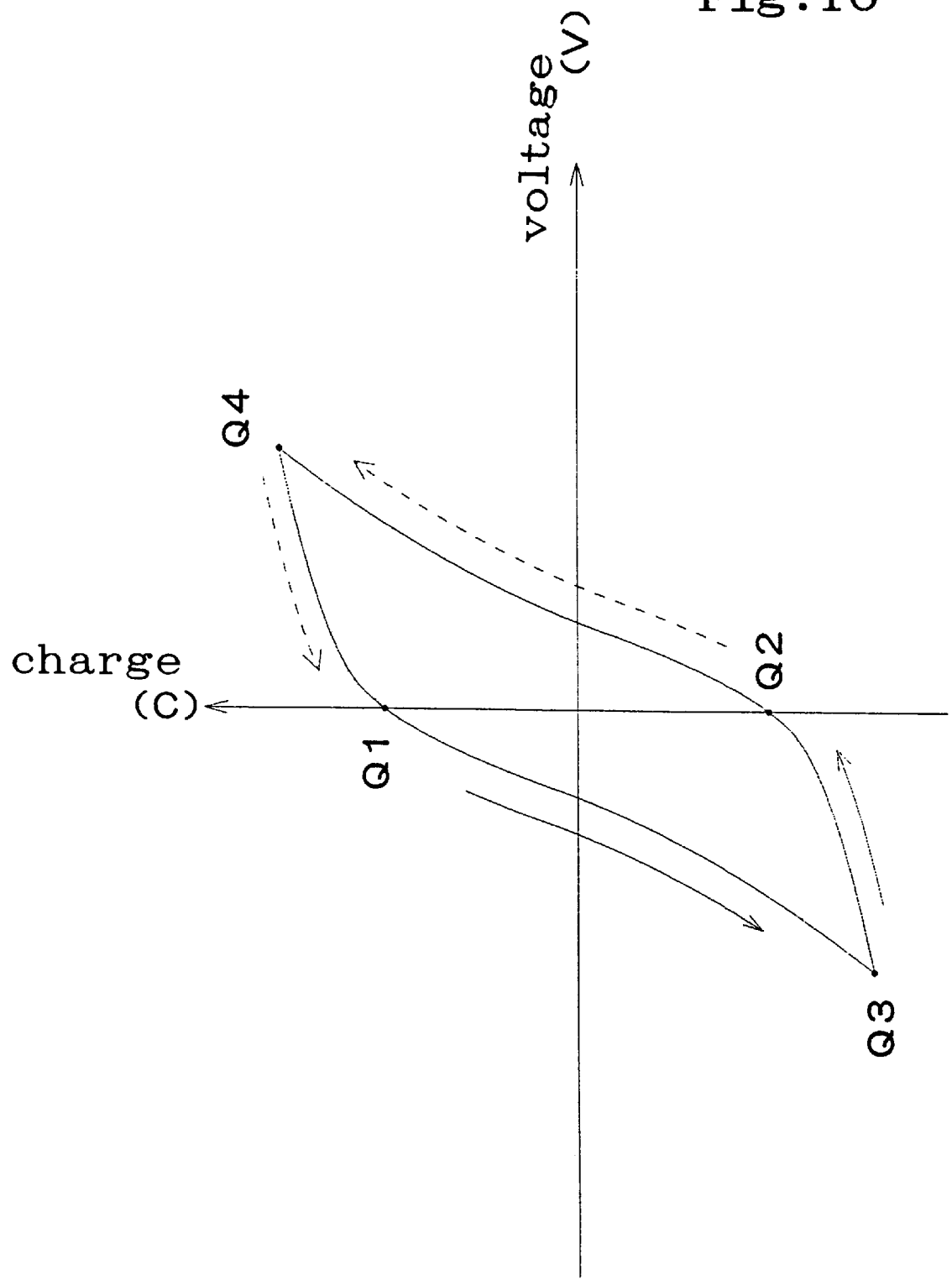
FIG. 10 illustrates voltage and electric charge (polarization) characteristics of a ferroelectric capacitor $C_{ferro}$.

As shown in FIGS. 3A and 3B, the memory transistor MT1 is a transistor constructed by connecting capacitors having ferroelectric layers 32 (ferroelectric capacitors $C_{ferro}$) in series over the floating gate 30. FIG. 10 is a graph that illustrates characteristics of voltage and electric charges (polarization) of a ferroelectric capacitor $C_{ferro}$. The voltage in FIG. 10 indicates the electric potential of the floating gate electrode FG relative to the electric potential of the control gate electrode CG. The electric charge is positive when the positive electric potential is applied to the floating gate electrode FG. Ferroelectric capacitors $C_{ferro}$ of the memory transistor MT1 during the standby period (refer to FIG. 4) are in a polarized state indicated by Q1 in FIG. 10. In other words, the state indicated by Q1 is a constant state of the ferroelectric capacitors $C_{ferro}$ of the memory transistor MT1 when Data "1" is stored.

Next, almost simultaneously as the write select transistor pair WTP11 goes ON to write Data "0", the electric potential of the floating gate electrode FG of the memory transistor MT1 becomes "L" (as explained above) as shown in FIG. 5. On the other hand, the electric potential of the drain electrode D of the memory transistor MT2 (that of the control gate electrode CG1 of the memory transistor MT1) is yet to change and remains in the state before the write operation starts ("H" in electric potential). As a result, the ferroelectric capacitors $C_{ferro}$ of the memory transistor MT1 are in a polarized state indicated by Q3 in FIG. 10.

Figure 6:
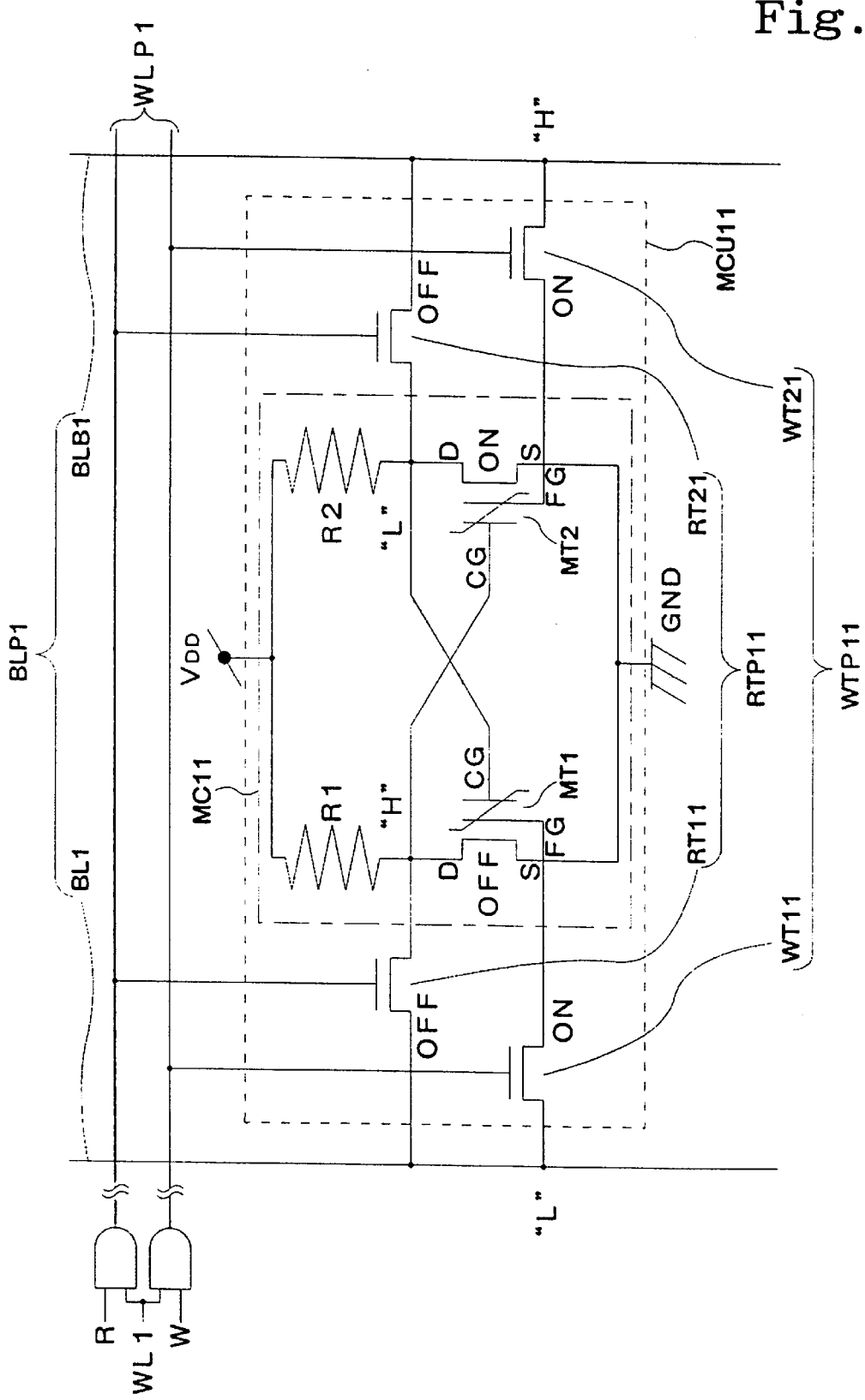
FIG. 6 illustrates a stable state during writing of Data "0" into the memory cell MC11.

As time passes, the electric potential of the drain electrode D of the memory transistor MT2 (the electric potential of the control gate electrode CG1 of the memory transistor MT1) starts to change to a constant "L" state. This state is shown in FIG. 6. Consequently, the ferroelectric capacitor $C_{ferro}$ of the memory transistor MT1 is in a polarized state indicated by Q2 in FIG. 10. To summarize, applying a voltage to the floating gates automatically creates the polarized state indicated by Q3. Accordingly, the ferroelectric capacitors $C_{ferro}$ of the memory transistor MT1 change their respective polarized state from that indicated by Q1 to that indicated by Q3 and then to that indicated by Q2 in FIG. 10 (as illustrated by solid line arrows) when Data "0" is written in the memory cell MC11 that already has Data "1" in storage. On the other hand, the ferroelectric capacitors $C_{ferro}$ of the memory transistor MT2 change their respective polarized state from that indicated by Q2 to that indicated by Q4, and then to that indicated by Q1 in FIG. 10 (as illustrated by dotted line arrows) in this write operation.

Figure 7:
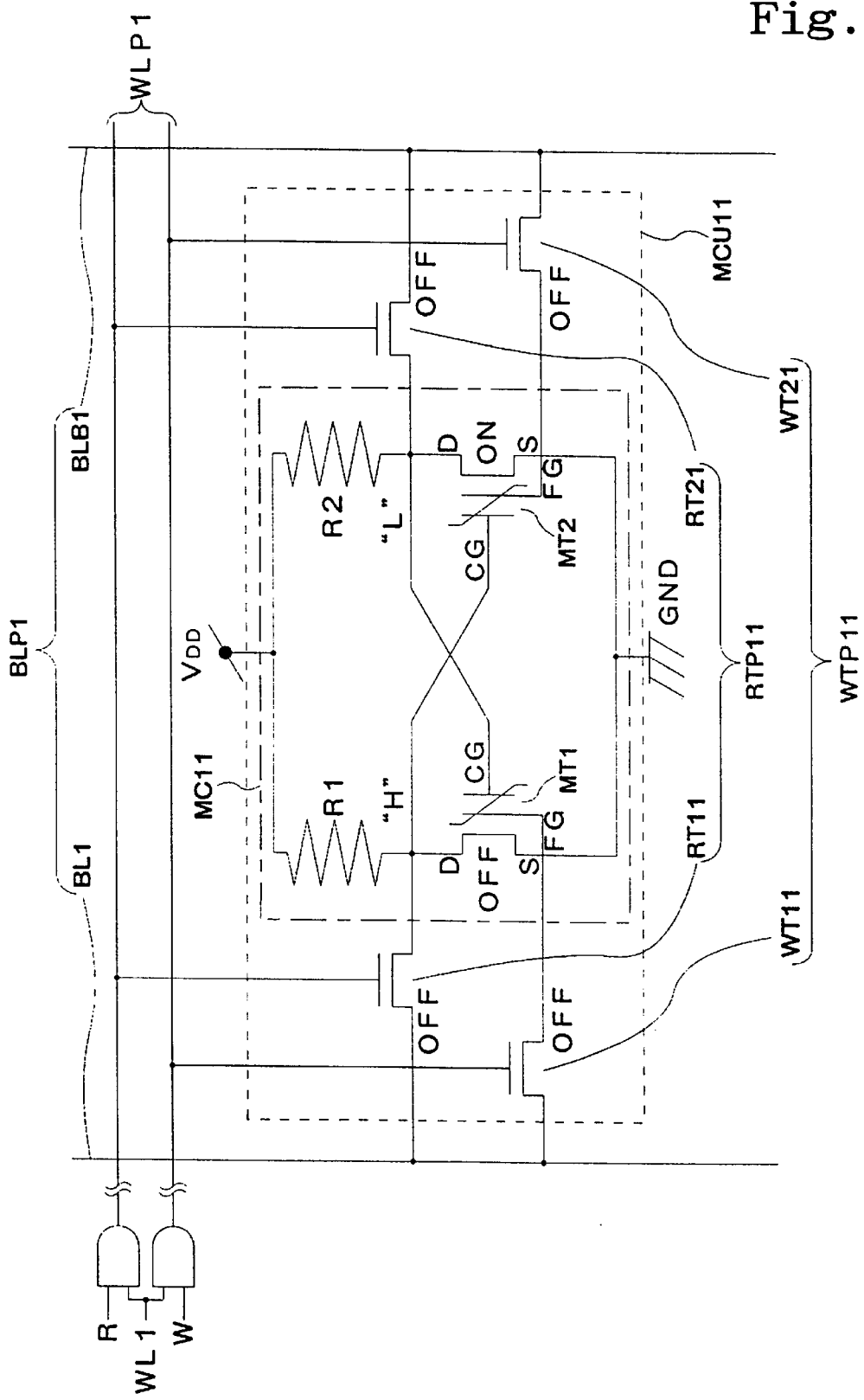
FIG. 7 illustrates a standby state of a memory cell MC11 holding data "0".

To end the write operation, the write control line W is applied with the "L" electric potential. This results in the write select transistor pair WTP11 to go OFF as shown in FIG. 7.

When the write select transistor pair WTP11 is OFF, the memory cell MC11 goes into a standby state. Because the memory cell MC11 has a self-latching capability, the memory transistor MT1 remains in the OFF state while the memory transistor MT2 remains in the ON state even when the memory cell MC11 is in a standby state. Consequently, the written Data "0" is retained in the memory cell MC11.

When the memory cell is in a standby state, the floating gate electrode FG is in the floating state. However, the electric potential of the floating gate electrode FG of the memory transistor MT1 remains unchanged. As a result, the ferroelectric capacitors $C_{ferro}$ stay in their respective polarized state indicated by Q2 in FIG. 10. In other words, the polarized state of ferroelectric capacitors $C_{ferro}$ stays unchanged when the write operation moves on to the standby state. Similarly, the ferroelectric capacitors $C_{ferro}$ of the memory transistor MT2 stay in their respective polarized state indicated by Q1 in FIG. 10. These polarized states of the ferroelectric capacitors $C_{ferro}$ are maintained even when the power source is cut off. Consequently, memory transistors MT1 and MT2 return to their respective ON and OFF states that correspond to polarized states of their respective ferroelectric capacitors $C_{ferro}$ when the power source is restored.

In summary, the ferroelectric capacitors $C_{ferro}$ of the memory transistors MT1 and MT2 maintain their polarized states as indicated by Q2 (the polarized state that generates the negative electric potential in the floating gate electrode FG) and Q1 (the polarized state that generates the positive electric potential in the floating gate electrode FG) in FIG. 10, respectively. Consequently, the memory transistor MT1 returns to the OFF state while the memory transistor MT2 returns to the ON state when the power source is restored. In other words, the memory cell MC11 returns to the state under which Data "0" is stored (refer to FIG. 7) when the power source is restored.

Next, the operation to write Data "1" in the memory cell MC11 is explained with reference to FIG. 8. As before, Data "1" is assumed to be stored in the memory cell MC11 before we start this write operation.

The state of the memory cell MC11 during the standby period (before the write operation starts) is shown in FIG. 4 as in the previous example. The operation to write Data "1" in the memory cell MC11 is almost identical to the operation to write Data "0". However, the electric potentials that correspond to Data "1" are applied to the bit line pair BLP1 as indicated in FIG. 8.

In other words, the bit line BL1 of the bit line pair BLP1 is applied with the high electric potential "H" (the power source electric potential $V_{DD}$), whereas the bit line BLB1 is applied with the low electric potential "L" (the ground electric potential). Next, as in the previous example, "H" in electric potential is applied to the word line WL 1 and "H" to the write control line W. This causes the write select transistor pair WTP11 to go ON. However, contrary to writing Data "0" in the aforementioned example, the electric potential of the floating gate electrode FG of the memory transistor MT1 in the memory cell MC11 remains in "H" in this case. Consequently, the memory transistor MT1 stays ON. Since the electric potential of the floating gate electrode FG of the memory transistor MT2 stays "L", the memory transistor MT2 stays OFF.

In short, the memory transistors MT1 and MT2 maintain their respective states during the standby period before the write operation starts (refer to FIG. 4) even when the write select transistor pair WTP11 is ON. As a result, the ferroelectric capacitors Cferro of the memory transistors MT1 and MT2 maintain their polarized states as indicated by Q1 and Q2 in FIG. 10, respectively, during the operation to write Data "1". Accordingly, the amount of stress on the ferroelectric layers is minimized because these polarized states remain unchanged during the process to write the same data in the memory cell and a potential number of actual reloading can be increased.

The ferroelectric capacitors $C_{ferro}$ of the memory transistors MT1 and MT2 maintain their polarized states as indicated by Q1 and Q2 in FIG. 10, respectively, even in the subsequent standby state. In other words, the polarized states of the ferroelectric capacitors $C_{ferro}$ of the memory transistors MT1 and MT2 remain unchanged before, during, and after the write operation to overwrite the data with the same contents in the memory cell MC11.

Figure 9:
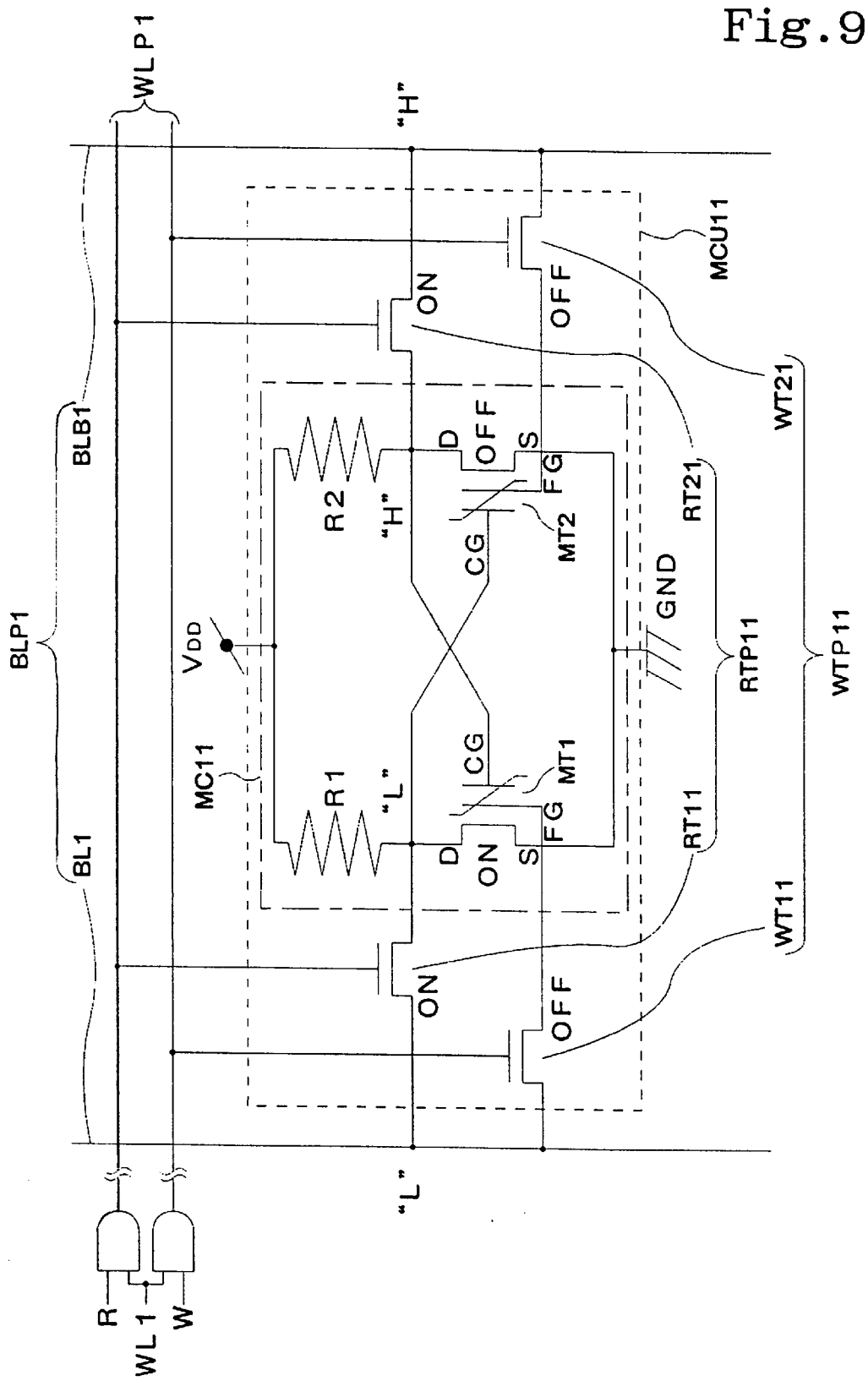
FIG. 9 illustrates reading Data "1" from the memory cell MC11.

Next, the operation to read Data "1" from the memory cell MC11 is explained with reference to FIG. 9. As before, Data "1" are assumed to be stored in the memory cell MC11 before the read operation starts. The state of the memory cell MC11 during the standby period (before the read operation starts) is shown in FIG. 4 as in the previous example. To read Data "1" from the memory cell MC11, first the word line WL1 is selected by the line decoder 12 shown in FIG. 1 and "H" in electric potential is applied to the word line WL1. Also "H" is applied to the read control line R. This causes the read select transistor pair RTP11 to go ON. When the read select transistor pair RTP11 goes ON, the voltage that corresponds to contents of the stored data generates in the bit line pair BLP1. In other words, the electric potential of the bit line BL1 is "L" whereas the voltage of the bit line pair BLP1 is "H" as shown in FIG. 9. Consequently, the contents of the data stored in the memory cell MC11 included in the memory cell unit MCU11 can be read by selecting the bit line pair BLP1 by the column decoder 14 (refer to FIG. 1) and detecting the voltage of the bit line pair BLP1. According to this embodiment of the present invention, the polarity of the differences in electric potentials of the bit line pair BLP1 to read data and the polarity of the difference in electric potentials of the bit line pair BLP1 to write data are set up to contrast even when the data is the same.

Figure 8:
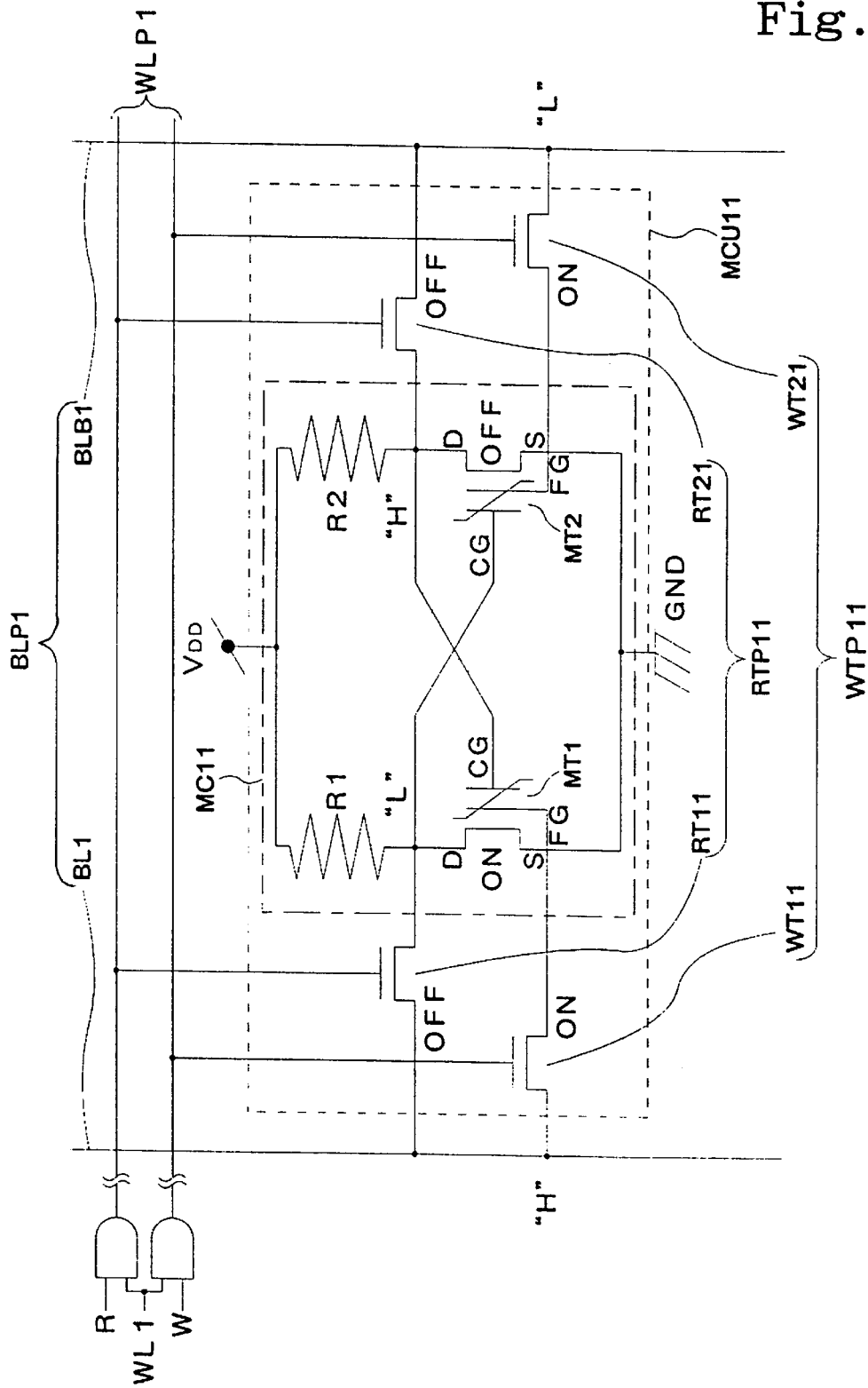
FIG. 8 illustrates writing Data "1" into the memory cell MC11.

To write Data "1" for example, the memory cell applies a "H" and "L" potential to the bit lines BL1 and BLB1 of the bit line pair BLP1, respectively (refer to FIG. 8). To read data, however, the memory cell determines that data is Data "1" because the memory cell detects that the electric potentials of the bit line BL1 and BLB1 are "H" and "L", respectively.

Although MFMIS structured transistors are used as examples of both memory transistors MT1 and MT2 of the pair of memory transistors in the memory cell MC11 in the above embodiment, one of the pair of the memory transistors MT1 and MT2 can be replaced with a regular MOSFET type transistor while keeping the other as a MFMIS structured transistor. Nevertheless, using MFMIS structured transistors for both memory transistors MT1 and MT2 as the pair is preferred because it further ensures that the memory cell MC11 returns to its state before the power source is cut off when the power source is restored. In other words, it makes it easier to realize a much more reliable memory apparatus. Furthermore, in the above embodiment, n-channel MOSFET type transistors are used as examples of memory transistors MT1 and MT2. However, the present invention is also applicable to memory transistors MT1 and MT2 that are p-channel MOSFET type transistors.

In the above embodiment, the memory cell including a pair of resistors R1 and R2 shown in FIG. 2 and a pair of memory transistors MT1 and MT2 is used as an example of a memory cell included in a memory unit of the memory apparatus 10 shown in FIG. 1. However, it should be understood that the memory cells are not to be limited only to this type. For example, the present invention is also applicable to other memory cells such as the one having a pair of memory transistors MT1 and MT2 and another pair of transistors.

Figure 11:
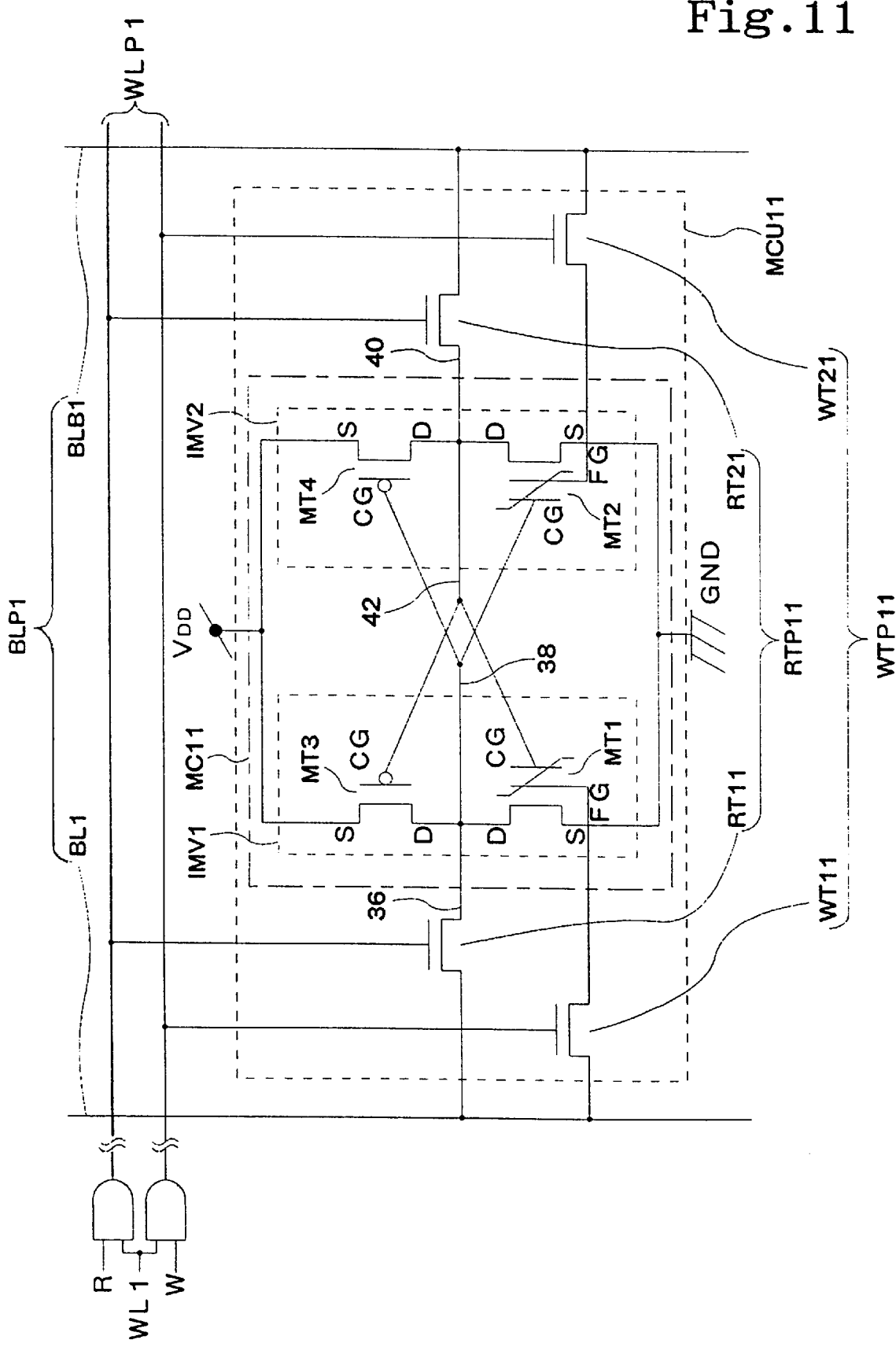
FIG. 11 is a memory cell MCI 1 included in a memory cell unit MCU11 in accordance with another embodiment of the present invention.

FIG. 11 illustrates another example of the memory cell MC11, a memory element included in a memory cell unit of memory apparatus in accordance with another embodiment of the present invention. In this embodiment, the memory cell includes a pair of memory transistors MT1, MT2 and another pair of transistors. In this embodiment, memory cell units MCU00, MCU01, and so forth comprised of memory cells including the memory cell MC11 shown in FIG. 11 are placed in series to configure the same memory apparatus as the memory apparatus 10 shown in FIG. 1. With reference to FIG. 11, the memory cell MC11 is used as an example to explain specific circuits of a memory cell in this embodiment.

The memory cell MC11 includes an inverter circuit INV1 defined as the first CMOS inverter and an inverter circuit INV2 defined as the NO. 2 CMOS inverter. The inverter circuit INV1 includes a memory transistor MT1 defined as the first transistor and a memory transistor MT3 defined as the third transistor that are connected at the drain electrodes D. The inverter circuit INV2 includes a memory transistor MT2 defined as the second transistor and a memory transistor MT4 defined as the fourth transistor that are connected at their drain electrodes D. Both the memory transistor MT1 and the memory transistor MT2 are n-channel MOSFET type transistors and MFMIS structured ferroelectric transistors as shown in FIG. 3A. On the other hand, both the memory transistors MT3 and MT4 are p-channel MOSFET type transistors with a regular structure.

An output terminal 36 of the inverter INV1 is connected to an input terminal 38 of the inverter circuit INV2 while an output terminal 40 of the inverter INV2 is connected to an input terminal 42 of the inverter circuit INV1. Accordingly, they are configured to give each other a positive feedback to maintain their respective output state to be opposite from each other.

As shown in FIG. 11, the output terminal 36 of the inverter INV1 and the output terminal 40 of the inverter circuit INV2 are connected by read select transistors RT11 and RT21 (the two transistors in combination are defined as the "read select transistor pair RTP11") to the bit lines BL1 and the BLB1 (the two data lines in combination are defined as the "bit line pair BLP1"), respectively. The gates of the read select transistor pair RTP11 are connected to one of the signal lines of the pair of the word line pair WLP1 that is the AND of the word line WL1 and the read control line R. Similarly to the embodiment shown in FIG. 2, the floating gate electrode FG of the memory transistor MT1 and the floating gate electrode FG of the memory transistor MT2 are connected by the write select transistors WT11 and WT21 (the two transistors in combination are defined as the "write select transistor pair WTP11") to the bit lines BL1 and BLB1, respectively. The gates of the write select transistor pair WTP11 are connected to one of the signal lines of the pair of the word line pair WLP1 that is the AND of the word line WL1 and the write control line W. Both source electrodes S of memory transistors MT1 and MT2 are connected to the ground line GND (the ground electric potential) while both source electrodes S of memory transistors MT3 and MT4 are connected to the power source line $V_{DD}$ (the power source electric potential $V_{DD}$). The read select transistors RT11 and RT12 and the write select transistors WT11 and WT12 are regular n-channel MOSFET type transistors similar to those in the embodiment shown in FIG. 2. Although the memory cell MC11 included in the memory cell unit MCU11 is used as an example in this embodiment, memory cells included in other memory cell units MCU00, MCU01, and so forth (refer to FIG. 1) have the identical configuration as the memory cell MC11.

The operation of the memory cell MC11 shown in FIG. 11 is similar to that of the memory cell MC11 shown in FIG. 2.

To write data in the memory cell 11 shown in FIG. 11, the write select transistor pair WTP11 is turned ON and the bit line BL1 is connected to the floating gate electrode FG of the memory transistor MT1 while the bit line BLB1 is connected to the floating gate electrode FG of the memory transistor MT2. Turning OFF the read select transistor RTP11 at this time cuts off connections between the bit line BL1 and the output terminal 36 of the inverter circuit INV1 and between the bit line BLB1 and the output terminal 40 of the inverter circuit INV2.

To read data from the memory cell 11 shown in FIG. 11, the read select transistor pair RTP11 is turned ON and the bit line BL1 is connected to the output terminal 36 of the inverter circuit INV1 while the bit line BLB1 is connected to the output terminal 40 of the inverter circuit INV2. Turning OFF the read select transistor pair WTP11 at this time cuts off connections between the bit line BL1 and the floating gate electrode FG of the memory transistor MT1 and between the bit line BLB1 and the floating gate electrode FG of the memory transistor MT2.

Another example of specific circuits of the memory cell MC11 in the memory cell unit MCU11 of a memory apparatus in accordance with yet another embodiment of the present invention is explained with reference to FIG. 12. Similar to the above embodiment shown in FIG. 11, the memory cell MC11 in this embodiment includes a pair of inverter circuits defined as INV1 and INV2. These inverter circuits are configured to give a positive feedback to each other to maintain their respective output state to be opposite from each other.

Figure 12:
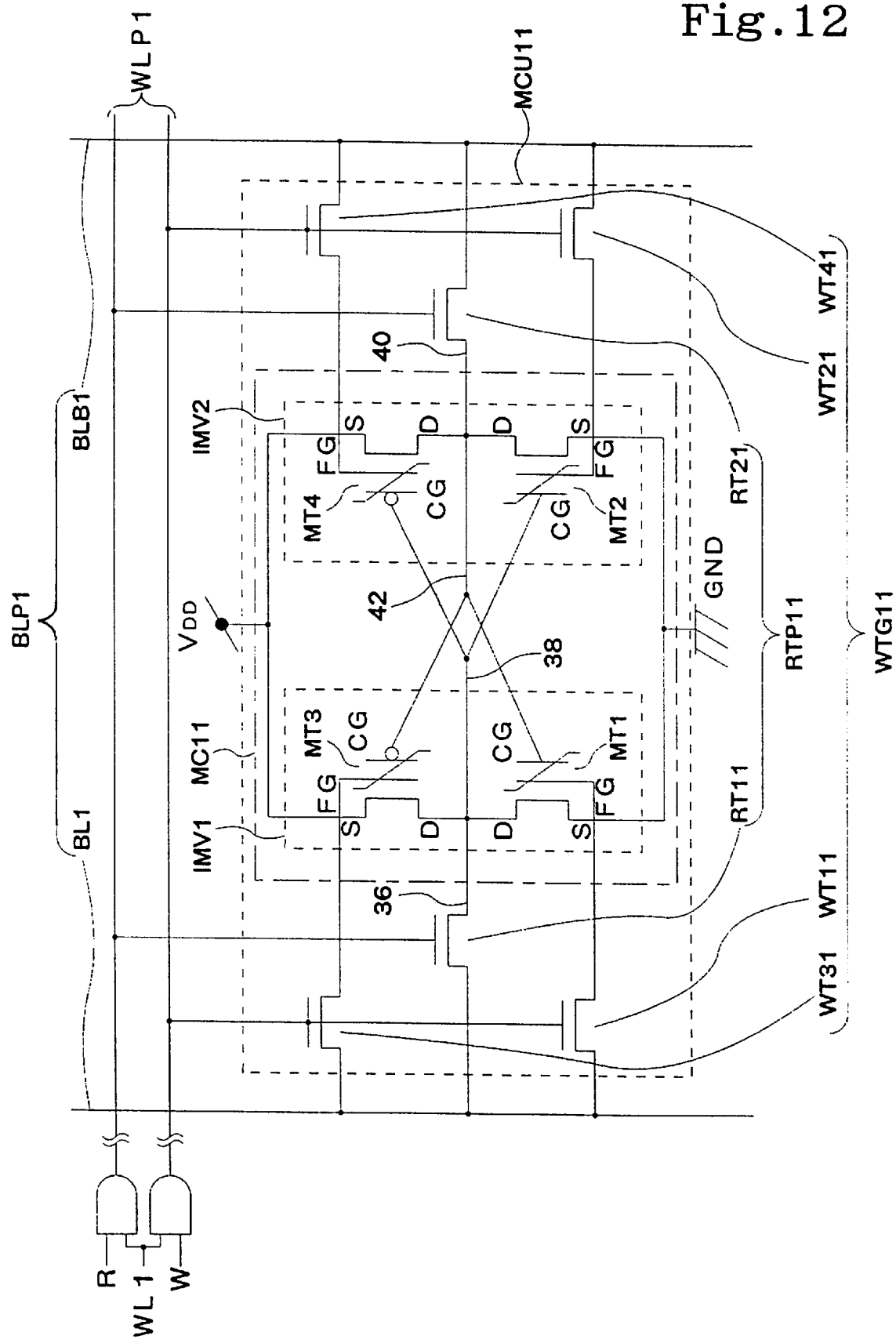
FIG. 12 is a memory cell MC11 included in a memory cell unit MCU11 in accordance with yet another embodiment of the present invention.

However, the memory cell MC11 in accordance with this embodiment shown in FIG. 12 is different from the memory cell MC11 in the embodiment shown in FIG. 11, specifically in that, not only the memory transistors MT1 and MT2, but also the memory transistors MT3 and MT4 in the memory cell MC11 in this embodiment are MFMIS structured ferroelectric transistors. Accordingly, the memory transistors MT1 and MT2 of the memory cell MC11 in the embodiment in FIG. 12 are MFMIS structured n-channel MOSFET type ferroelectric transistors while the memory transistors MT3 and MT4 are MFMIS structured p-channel MOSFET type ferroelectric transistors.

The memory cell in accordance with this embodiment is configured identically to that of the embodiment in FIG. 11. Accordingly, the output terminal 36 of the inverter INV1 and the output terminal 40 of the inverter circuit INV2 are connected by read select transistors RT11 and RT21 (the two transistors in combination are defined as the "read select transistor pair RTP11") to the bit lines BL1 and the BLB1 (the two data lines in combination are defined as the "bit line pair BLP1"), respectively. The gates of the read select transistor pair RTP11 are also connected to one of the signal lines of the pair of the word line pair WLP1 that is the AND of the word line WL1 and the read control line R. Similarly to the embodiment shown in FIG. 11, the floating gate electrode FG of the memory transistor MT1 and the floating gate electrode FG of the memory transistor MT2 are connected by the write select transistors WT11 and WT21 to the bit lines BL1 and BLB1, respectively. In contrast to the embodiment in FIG. 11, however, the floating gate electrode FG of the memory transistor MT3 and the floating gate electrode FG of the memory transistor MT4 are connected by the write select transistors WT31 and WT41 to the bit lines BL1 and BLB1, respectively. The write select transistors WT11, WT21, WT31 and WT41 in combination are defined as a "write select transistor group WTG11". The gates of the write select transistor group WTG11 are connected to one of the signal lines of the pair of the word line pair WLP1 that is the AND of the word line WL1 and the write control line W.

The operation of the memory cell MC11 shown in FIG. 12 is similar to that of the memory cell MC11 in FIG. 11. However, using MFMIS structured transistors for all four (4) memory transistors MT1, MT2, MT3, and MT4 is preferable because it further ensures that the memory cell MC11 returns to its state before the power source is cut off when the power source is restored. In other words, this setup makes it much easier to realize a much more reliable memory apparatus.

Also the ferroelectric capacitors $C_{ferro}$ of one of the inverter circuits in the memory cell MC11 in FIG. 12, for example, the ferroelectric capacitors $C_{ferro}$ of MT1 and MT3 of the inverter circuit INV1, are in the same polarized state. In other words, when the ferroelectric capacitors $C_{ferro}$ of the memory transistor MT1 are in the polarized state indicated by Q1 (the polarized state that generates the positive electric potential to the floating gate electrode FG), the ferroelectric capacitors $C_{ferro}$ of the memory transistor MT3 are also in the polarized state indicated by Q1. In this state, the memory transistor MT1 is ON while the memory transistor MT3 is OFF. In the above state, the ferroelectric capacitors $C_{ferro}$ of a pair of memory transistors MT2 and MT4 of the other inverter circuit INV2 are in the polarized state indicated by Q2 (the polarized state that generates the negative electric potential to the floating gate electrode FG). In this state, the memory transistor MT2 is OFF while the memory transistor MT4 is ON.

The memory transistors MT1 and MT2 of the memory cell MC11 are chosen to be MFMIS structured transistors in the embodiment in FIG. 11. However, all four (4) memory transistors MT1, MT2, MT3 and MT4 of the memory cell MC11 in the embodiment in FIG. 12 are MFMIS structured transistors. However, choosing which or how many of the four (4) memory transistors MT1, MT2, MT3 and MT4 are to be MFMIS structured transistors should not to be limited only to these examples used in the above noted embodiments. Any number between one and four of the memory transistors MT1, MT2, MT3 and MT4 can be MFMIS structured transistors.

Figure 13:
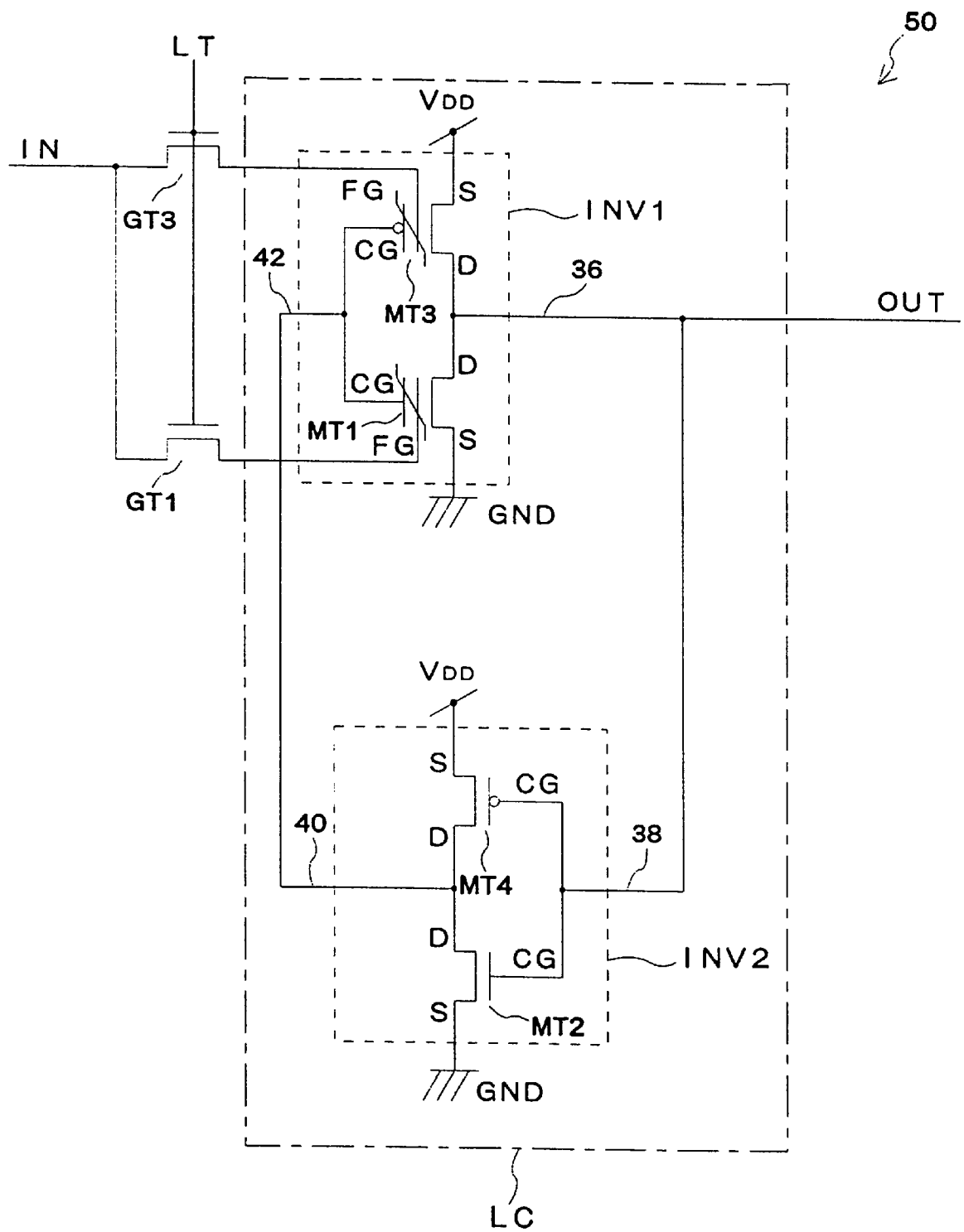
FIG. 13 is a latch circuit 50 for a memory apparatus in accordance with yet another embodiment of the present invention.

Next, with reference to FIG. 13, a latch circuit 50 of a data holding apparatus in accordance with yet another embodiment of the present invention is explained. The latch circuit 50 includes a latch cell that includes an inverter circuit INV1 defined as the first CMOS inverter and an inverter circuit INV2 defined as the second CMOS inverter. The inverter circuit INV1 includes a memory transistor MT1 defined as the first transistor and a memory transistor MT3 defined as the third transistor. They are connected at their drain electrodes D. The inverter circuit INV2 is equipped with a memory transistor MT2 defined as the second transistor and a memory transistor MT4 defined as the fourth transistor. They are also connected at their drain electrodes D.

Both the memory transistor MT1 and the memory transistor MT2 are n-channel MOSFET type transistors whereas both the memory transistor MT3 and the memory transistor MT4 are p-channel MOSFET type transistors. Both the memory transistor MT1 and the memory transistor MT2 of the inverter circuit INV1 are MFMIS structured ferroelectric transistors whereas both the memory transistor MT3 and the memory transistor MT4 of the inverter circuit INV2 are MOSFET type transistors with a regular structure.

The output terminal 36 of the inverter INV1 is connected to the input terminal 38 of the inverter circuit INV2 whereas the output terminal 40 of the inverter INV2 is connected to the input terminal 42 of the inverter circuit INV1. Accordingly, they are configured to give a positive feedback to each other to maintain their respective output state to be opposite from each other.

In this latch circuit as shown in FIG. 13, the floating gate electrodes FG of the memory transistors MT1 and MT3 of the inverter INV1 are connected to an input line IN by the gate transistors GT1 and GT3, respectively. The gates of the gate transistors GT1 and GT3 are connected to a latch signal line LT. The output terminal 36 of the inverter circuit INV1 is connected to an output line OUT. Both source electrodes S of the memory transistors MT1 and MT2 are connected to the ground line GND (the ground electric potential) whereas both source electrodes S of the memory transistors MT3 and MT4 are connected to the power source line $V_{DD}$ (the power source electric potential $V_{DD}$). The gate transistors GT1 and GT3 are both n-channel MOSFET type transistors with regular structure.

To refresh data, the latch signal line LT in the latch circuit 50 shown in FIG. 13 is applied with "H" in electric potential to turn ON the gate transistors GT1 and GT3. This causes the input line IN to be connected with the floating gate electrodes FG of the memory transistors MT1 and MT3. By connecting the input line IN to the floating gate electrodes FG of the memory transistors MT1 and MT3, the inverse of the data signal of the input line IN is output to the output line OUT without any modification. For example, when data of the input line IN is "H" in electric potential, data of the output line OUT becomes "L" in electric potential.

On the other hand, to hold data, the latch signal line LT is applied with the "L" electric potential to turn OFF the gate transistors GT1 and GT3. This causes the connections between the input line IN and the floating gate electrodes FG of the memory transistors MT1 and MT3 to be cut off. When the connections between the input line IN and floating gate electrodes FG of memory transistors MT1 and MT3 are cut off, the inverse of the data signal of the input line IN just before respective communications are cut off is output to the output line OUT. Consequently, data of the output line OUT does not change even when data of the input line IN subsequently changes. In other words, the latch circuit 50 is a circuit that latches data when the latch signal line LT falls.

When the input line IN and the floating gate electrodes FG of the memory transistors MT1 and MT3 are connected, the ferroelectric capacitors $C_{ferro}$ (refer to FIG. 3B) of the memory transistors MT1 and MT3 shown in FIG. 13 are in the polarized state that corresponds to data of the input line IN similar to the ferroelectric capacitors $C_{ferro}$ of memory transistors MT1 and MT3 in FIG. 12. For example, when data of the input line IN is applied with the "H" electric potential, the ferroelectric capacitors $C_{ferro}$ of both the memory transistors MT1 and MT3 are in the polarized state indicated by Q1 in FIG. 10 (the polarized state that generates the positive electric potential in floating gate electrodes FG). In this state, the memory transistor MT1 is ON and the memory transistor MT3 is OFF. The ON or OFF state of the memory transistors MT1 and MT3 and the polarized state of the ferroelectric capacitors $C_{ferro}$ of these transistors do not change even when the connections between the input line IN and floating gate electrodes FG of memory transistors MT1 and MT3 are cut off. Moreover, both memory transistors maintain their respective polarized state of their ferroelectric capacitors $C_{ferro}$ even when the power source is cut off. Consequently, memory transistors MT1 and MT3, similar to memory transistors MT1 and MT3 in FIG. 12, return to their respective ON or OFF state before the power is cut off when the power source is restored.

Next, a latch circuit 60 of a data holding apparatus in accordance with yet another embodiment of the present invention is explained with reference to FIG. 14. The latch circuit 60 is configured similarly to the latch circuit 50 in FIG. 13. One of the differences is that in the latch circuit 60, not only the memory transistors MT1 and MT3 of the inverter circuit INV1, but also memory transistors MT2 and MT4 of the inverter circuit INV2 are MFMIS structured ferroelectric transistors (refer to FIG. 3A). Another difference is that the latch circuit 60 includes two input lines, namely, an input line IN defined as the first input line and an input line INB defined as the second input line; and two output lines, namely, an output line OUT defined as the first output line and an output line OUTB defined as the second output line.

Figure 14:
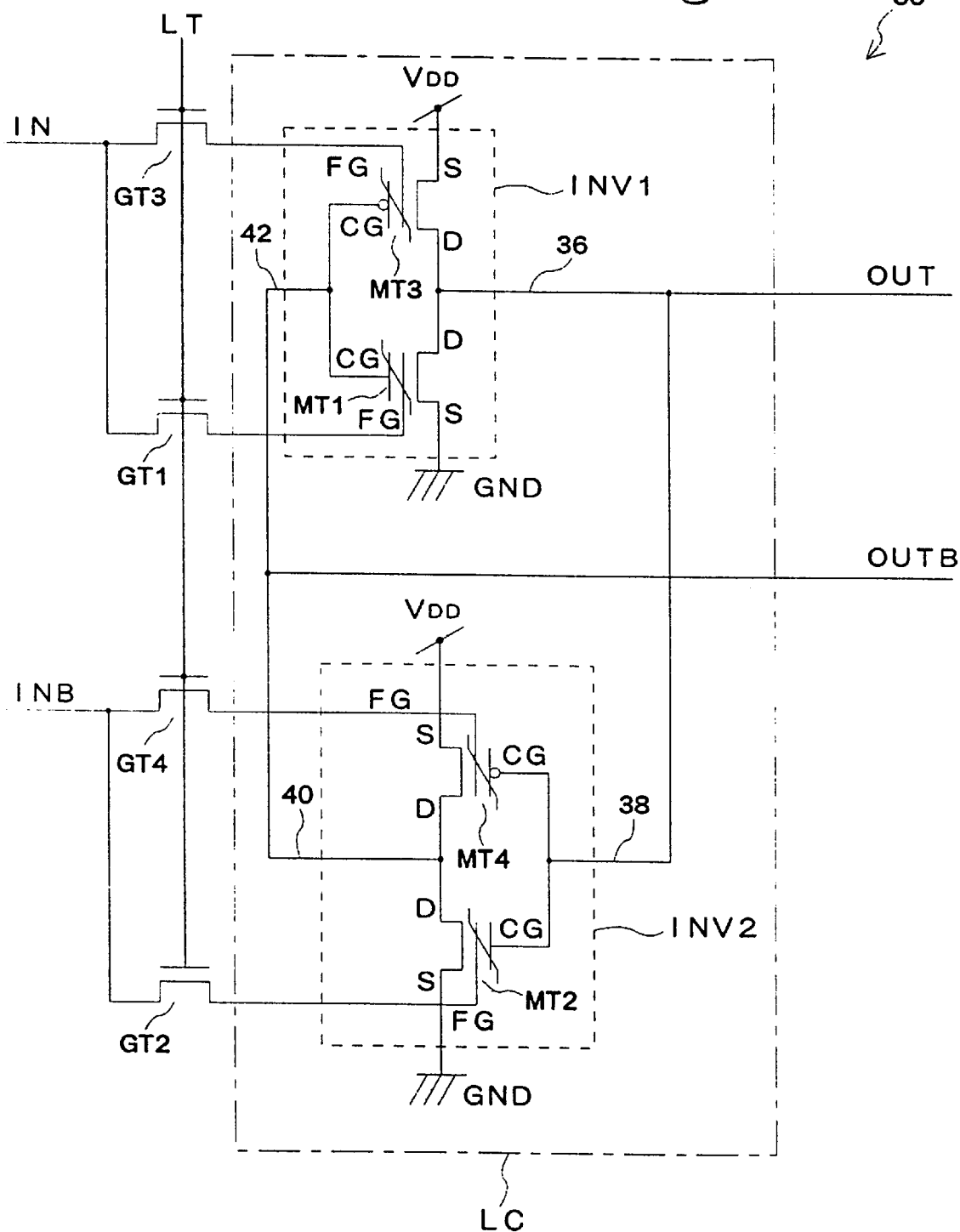
FIG. 14 is a latch circuit 60 for a memory apparatus in accordance with yet another embodiment of the present invention.

In this latch circuit 60 as shown in FIG. 14, the floating gate electrodes FG of the memory transistors MT1 and MT3 of the inverter circuit INV1 are connected to the input line IN by the gate transistors GT1 and GT3, respectively, while the floating gate electrodes FG of the memory transistors MT2 and MT4 of the inverter INV2 are connected to the input line INB by the gate transistors GT2 and GT4, respectively. All the gates of the gate transistors GT1 through GT4 are connected to a latch signal line LT. Also, the output terminal 36 of the inverter circuit INV1 is connected to the output line OUT while the output terminal 40 of the inverter circuit INV2 is connected to the output line OUTB. All the gate transistors GT1 through GT4 are n-channel MOSFET type transistors with regular structure.

To refresh data in the latch circuit 60 shown in FIG. 14, the latch signal line LT is applied with "H" in electric potential to turn ON all the gate transistors GT1 through GT4. This results in the input line IN to be connected with the floating gate electrodes FG of memory transistors MT1 and MT3 and the input line INB to be connected with the floating gate electrodes FG of the memory transistors MT2 and MT4. By connecting the input line IN to the floating gate electrodes FG of the memory transistors MT1 and MT3, an inverse of the data signal of the input line IN is output to the output line OUT without any modification. Also, connecting the input line INB to the floating gate electrodes FG of the memory transistors MT2 and MT4 outputs the inverse of the data signal of the input line INB without any modification to the output line OUTB. For example, when data of the input line IN is "H" in electric potential (in other words, data of the input line INB are "L" in electric potential), data of the output line OUT becomes "L" in electric potential and data of the output line OUTB becomes "H" in electric potential.

To hold data, the latch signal line LT is applied with the "L" electric potential to turn OFF all gate transistors GT1 through GT4. This cuts off the connections between the input line IN and the floating gate electrodes FG of the memory transistors MT1 and MT3 and the connections between the input line INB and the floating gate electrodes FG of the memory transistors MT2 and MT4. The inverse of the data signal of the input line IN just before respective communications are cut off is output to data of the output line OUT, and the inverse of the data signal of the input line INB is output without any modification to data of the output line OUTB. Consequently, data of the output line OUT (and output line OUTB) does not change even when data of the input line IN (and input line INB) subsequently changes.

While the input line IN is connected to the floating gate electrodes FG of the memory transistors MT1 and MT3 and the input line INB is connected to the floating gate electrodes FG of the memory transistors MT2 and MT4, the ferroelectric capacitors $C_{ferro}$ (refer to FIG. 3B) of the memory transistors MT1 through MT4 shown in FIG. 14 are in their respective polarized states that correspond to data of the input line IN and input line INB similar to the ferroelectric capacitors $C_{ferro}$ of the memory transistors MT1 through MT4 in FIG. 12. For example, when data of the input line IN is "H" in electric potential, the ferroelectric capacitors $C_{ferro}$ of both the memory transistors MT1 and MT3 are in the polarized state indicated by Q1 in FIG. 10 (the polarized state that generates the positive electric potential in floating gate electrodes FG) while the ferroelectric capacitors $C_{ferro}$ of both the memory transistors MT2 and MT4 are in the polarized state indicated by Q2 in FIG. 10 (the polarized state that generates the negative electric potential in floating gate electrodes FG). In this state, the memory transistor MT1 is ON and the memory transistor MT3 is OFF while the memory transistor MT2 is OFF and the memory transistor MT4 is ON. The ON or OFF states of the memory transistors MT1 through MT4 and polarized states of the ferroelectric capacitors $C_{ferro}$ of these transistors do not change even when the connections between the input line IN and the floating gate electrodes FG of the memory transistors MT1 through MT4 are cut off. Moreover, these ferroelectric capacitors $C_{ferro}$ maintain their respective polarized states even when the power source is cut off. Consequently, the memory transistors MT1 through MT4 return to their respective ON and OFF states before the power is cut off when the power source is restored as the memory transistors MT1 through MT4 in FIG. 12.

The memory transistors MT1 and MT3 of four (4) memory transistors MT1 through MT4 of the memory cell MC11 are chosen to be MFMIS structured transistors in the embodiment in FIG. 13 while all four (4) memory transistors MT1 through MT4 of the memory cell MC11 in the embodiment in FIG. 14 are MFMIS structured transistors. Nevertheless, choosing which or how many of four (4) memory transistors MT1 through MT4 are to be MFMIS structured transistors should not to be limited only to these examples used in the above noted embodiments. Any number between one and four of the memory transistors MT1 through MT4 can be MFMIS structured transistors.

Next, a latch circuit 70 in accordance with yet another embodiment of the present invention is described with reference to FIG. 15. The latch circuit 70 is a bus latch circuit that includes a memory transistor MT and an inverter circuit INV. In the latch circuit 70, the memory transistor MT is a p-channel MOSFET type transistor which is a MFMIS structured ferroelectric transistor (refer to FIG. 3A). The inverter circuit INV is a CMOS structured inverter. Both the source electrode S and the control gate electrode CG of the memory transistor MT are connected to a power source line $V_{DD}$ (the power source electric potential $V_{DD}$), one of the lines of the pair of power source supply lines. A drain electrode D of the memory transistor MT is connected to a bus line 72. The bus line 72 is connected by the inverter circuit INV to a floating gate electrode FG of the memory transistor MT.

In the latch circuit 70 shown in FIG. 15, the memory transistor MT goes ON when the power source is input which will be noted later. When the memory transistor MT goes ON, the bus line becomes "H" in electric potential resulting in the electric potential of the floating gate electrode FG of the memory transistor MT to be "L" in electric potential. Consequently, the memory transistor MT stays ON and the bus line 72 is latched on to the electric potential "H". Because the floating gate electrode FG of the memory transistor MT becomes "H" in electric potential when the "L" electric potential signal is sent to the bus line 72, the memory transistor MT turns OFF and the latch is released. In the latched state, the control gate electrode of the memory transistor MT is applied with "H" in electric potential while the floating gate electrode FG of the memory transistor MT is applied with "L" in electric potential. Consequently, the ferroelectric capacitors $C_{ferro}$ of the memory transistor MT are in the polarized state indicated by Q3 in FIG. 10 (the polarized state that generates the negative electric potential in the floating gate electrode FG). When the latch is released, both the control gate electrode and the floating gate electrode FG of the memory transistor MT are applied with "H" in electric potential. Therefore, the ferroelectric capacitors $C_{ferro}$ of the memory transistor MT are in the polarized state indicated by Q2 in FIG. 10. In other words, these ferroelectric capacitors $C_{ferro}$ of the memory transistor MT do not invert their polarized state even when the latch is released. Regardless of whether the latch is on or off, both the control gate electrode and the floating gate electrode FG of the memory transistor MT are in the floating state when the power source is off. Therefore, the ferroelectric capacitors $C_{ferro}$ of the memory transistor MT are in the polarized state indicated by Q2 in FIG. 10. Accordingly, the memory transistor MT returns to the ON/OFF state that corresponds to the polarized state indicated by Q2 (the ON state) when the power source is restored. In other words, the bus line 72 is latched on to the electric potential "H" simultaneously as the power source is turned on.

Figure 15:
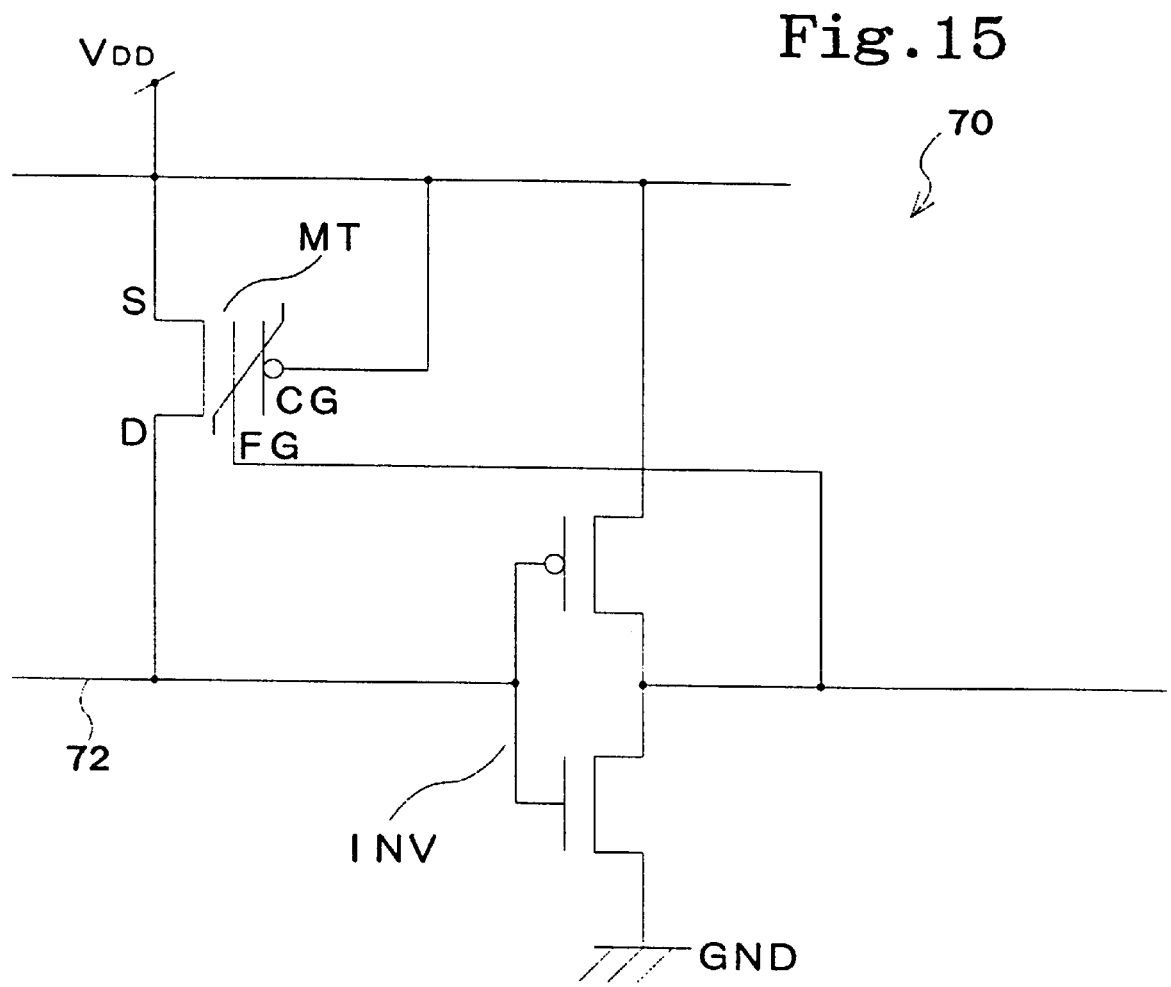
FIG. 15 is a latch circuit 70 for a memory apparatus in accordance with yet another embodiment of the present invention.

Although the bus latch circuit of which the bus line is latched on to the "H" electric potential and of which the latch is released when the "L" electric potential signal is sent to the bus line was used as an example of a bus latch circuit in the embodiment in FIG. 15, the present invention is not limited only to this type of a bus latch circuit. For example, the present invention can also be applied to a bus latch circuit of which a bus line is latched on to the "L" electric potential and of which the latch is released when the "H" electric potential signal is sent to the bus line. In this case, the ground line GND (the ground electric potential GND) is used for one of the lines of the pair of power source supply lines and an n-channel MOSFET type ferroelectric transistor with the MFMIS structure is used for the memory transistor MT of the subject latch circuit.

Figure 16:
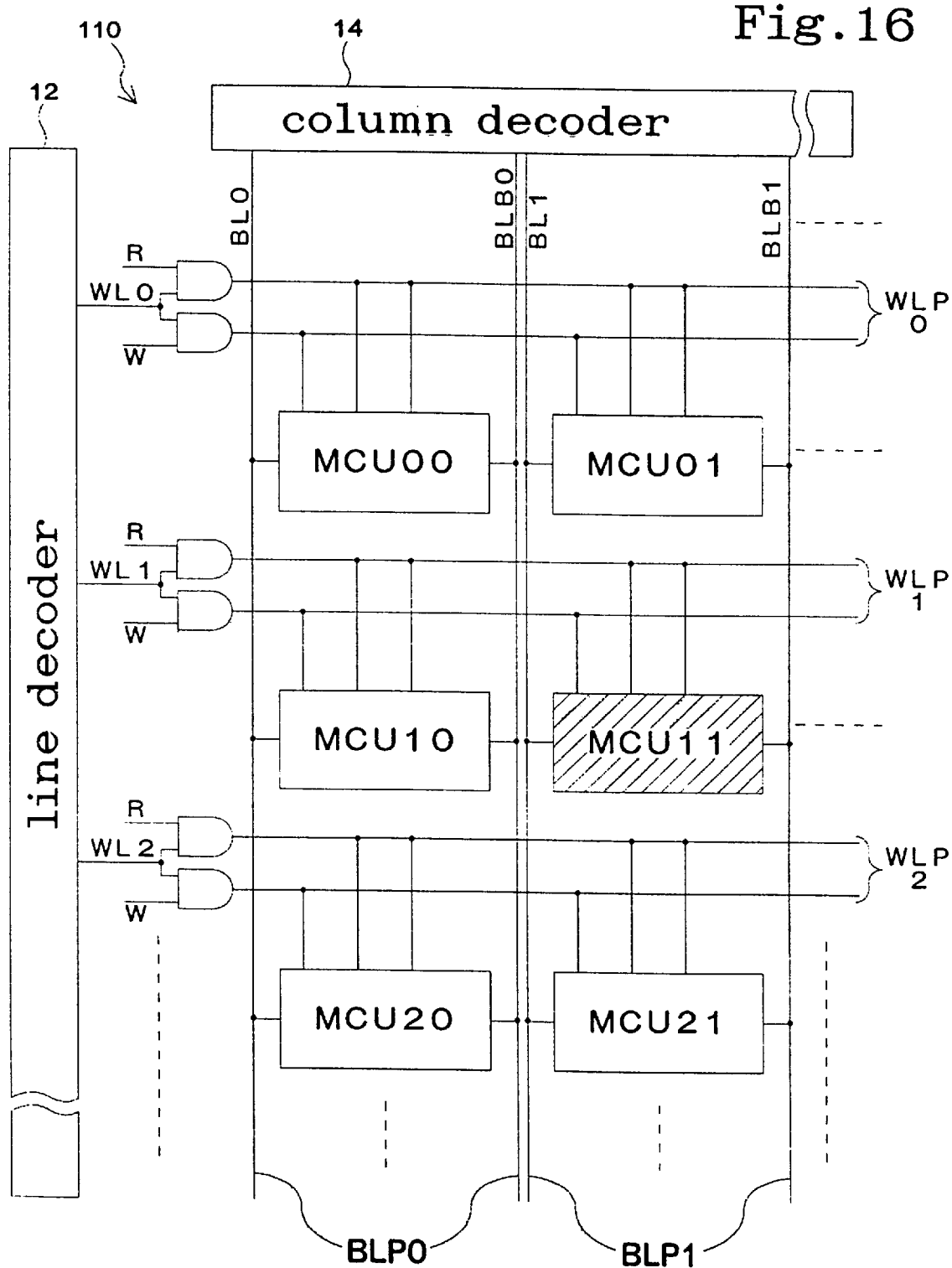
FIG. 16 illustrates a memory apparatus 110 in accordance with another embodiment of the present invention.

FIG. 16 illustrates the configuration of a memory apparatus 110 in accordance with yet another embodiment of this invention. This memory apparatus is similarly structured to the memory apparatus 10 shown in FIG. 1. Several memory cell units MCU00, MCU01, and so forth are placed in an array. A memory cell unit MCU11 is used to explain the memory apparatus 119. The composition of other memory units MCU00, MCU01, and so forth is the same as that of the memory cell unit MCU11. Accordingly, the following explanation is equally applicable to all of memory cell units MCU00, MCU01, and so forth.

Figure 17:
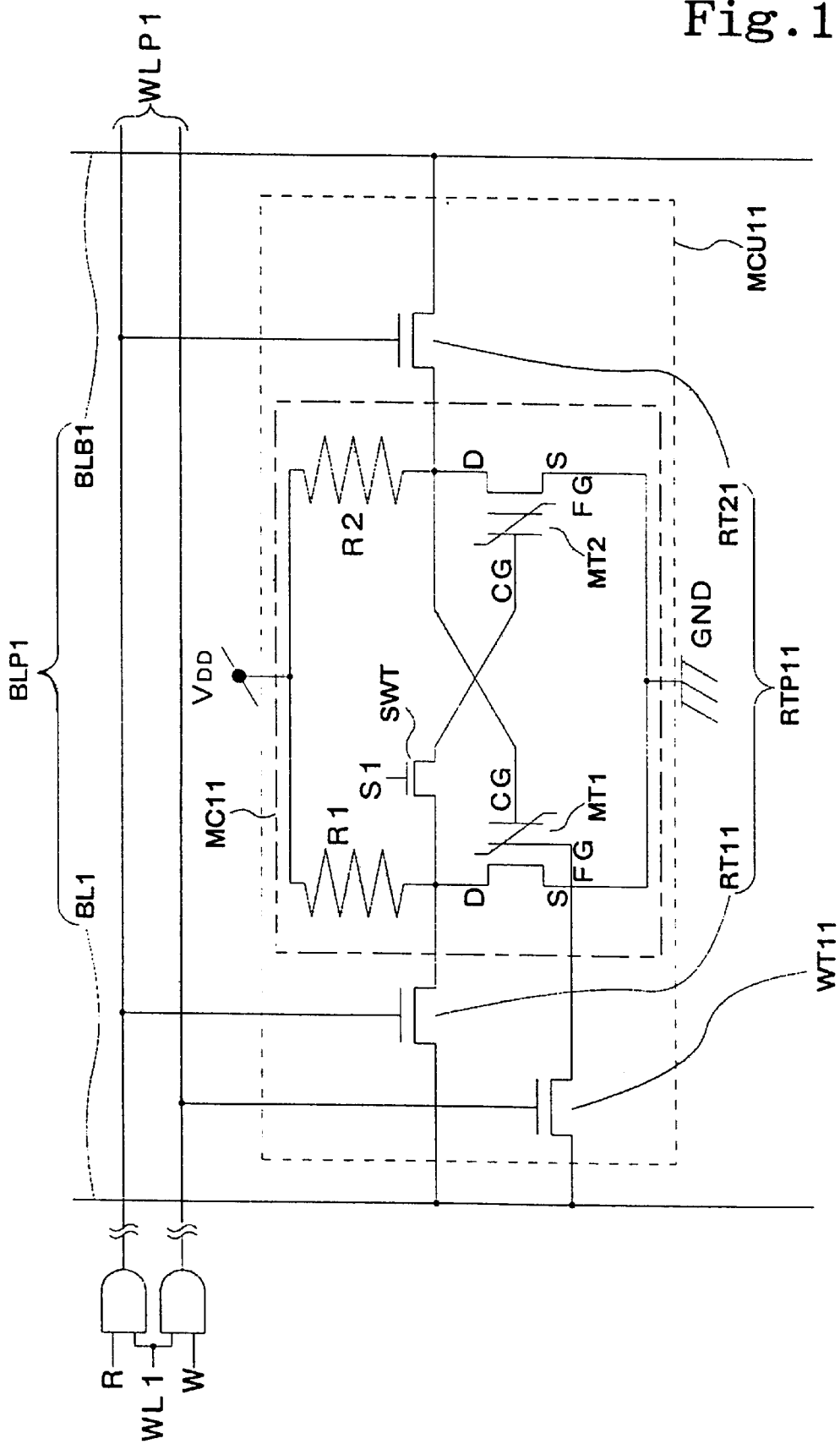
FIG. 17 shows a memory cell MC11 included in a memory cell unit MCU11 comprising the memory apparatus 110.

As shown in FIG. 17, the memory cell unit MCU11 is similar to the memory cell unit in FIG. 2. The memory cell unit MCU11 includes a memory cell MC11, a memory element, a read select transistor pair RTP11, and a write select transistor pair WTP11. The memory cell MC11 is connected to the intersection of a word line pair WLP1 and a bit line pair BLP1. In contrast to the memory cell in FIG. 2, however, a floating gate electrode FG of a memory transistor MT2 of this memory cell is not connected to any line. Consequently, the memory cell unit MCU11 in accordance with this embodiment is not provided with a write select transistor WT21.

As shown in FIG. 16, all word line pairs WLP0, WLP1, WLP2, and so forth are pairs of signal lines of which one line is the AND of a read control line R and word lines WL0, WL1, WL2, and so forth, whereas the other line is the AND of a write control line W and the above word lines. All the word lines WL0, WL1, WL2, and so forth are connected to a line decoder 12 while bit line pairs BLP0, BLP1, and so forth are connected to a column decoder 14. Thus, by selecting one word line (the word line WL1 for example) by the line decoder 12 and one bit line pair (BLP1 for example) by the column decoder 14, one memory cell (MC11) is selected by one read select transistor pair (RTP11) to read data and one memory cell (MC11) is selected by one write select transistor (WT11) to write data.

The memory cell MC11 included in the memory cell unit MCU11 is used to explain specific circuits of a memory cell with reference to FIG. 17. The memory cell MC11 includes a memory transistor MT1 defined as the first transistor, a memory transistor MT2 defined as the second transistor, a switching transistor SWT which is a switching element, a resistor R1 defined as the first pull-up resistor, and a resistor R2 defined as the second pull-up resistor. These components are connected as shown in FIG. 17. The memory cell MC11 is configured in a manner in which a control gate electrode CG of the memory transistor MT1 is connected to a drain electrode D of the memory transistor MT2 and the control gate electrode CG of the memory transistor MT2 is connected to the drain electrode D of the memory transistor MT1 by the switching transistor SWT. The gate of the switching transistor SWT is applied with a switching signal S1. When the switching signal S1 is "H" in electric potential, the switching transistor SWT is ON and the switching transistor SWT goes OFF when the switching signal S1 becomes "L" in electric potential. The memory cell is configured to turn ON the switching transistor SWT for the memory transistors to give a positive feedback to one another to maintain an ON or OFF state that is opposite from the other. The memory transistors MT1 and MT2 are so-called MFMIS structured ferroelectric transistors similar to those in the embodiment in FIG. 2.

Referring back to the memory cell MC11 in FIG. 17, the drain electrode D of the memory transistor MT1 and the drain electrode D of the memory transistor MT2 are connected by the read select transistors RT11 and RT21 (both transistors in combination are defined as the "read select transistor pair RTP11") to a bit line BL1 defined as the first data line and a BLB1 defined as the second data line, respectively. (The two data lines in combination are defined as the "bit line pair BLP1".) The gates of the read select transistor pair RTP11 are connected to one of the signal lines of the word line pair WLP1 that is the AND of a word line WL1 and a read control line R. The floating gate electrode FG of the memory transistor MT1 is connected by a write select transistor WT11 to the bit line BL1. However, the floating gate electrode FG of the memory transistor MT2 is not connected to any line and remains in the constant floating state as noted above. The gate of the write select transistor WT11 is connected to one of the signal lines of the word line pair WLP1 that is the AND of the word line WL1 and a write control line W. The drain electrodes D of the memory transistors MT1 and MT2 are connected to the power source line $V_{DD}$ (the power source electric potential $V_{DD}$) defined as the first power source supply line by resistors R1 and R2, respectively. Both source electrodes S are connected to the ground line GND (the ground electric potential) defined as the second power source supply line. In addition, the read select transistors RT11 and RT12, write select transistors WT11 and WT12, and switching transistor SWT are all regular n-channel MOSFET type transistors.

Although the memory cell MC11 included in the memory cell unit MCU11 has been used as an example to explain memory cells, all memory cells included in other memory cell units MCU00, MCU01, and so forth in FIG. 16 have the same structure as the memory cell MC11.

The operation of the memory cell MC11 included in the memory cell unit MCU11 shown in FIG. 17 is described below. To write data, turning ON the write select transistor WT11 connects the bit line BL1 to the floating gate electrode FG of the memory transistor MT1. By simultaneously turning OFF the read select transistor pair RTP11, the connections between the bit line BL1 and the drain electrode D of the memory transistor MT1 and the connection between the bit line BLB1 and the drain electrode D of the memory transistor MT2 are cut off. On the other hand, the read select transistor pair RTP11 goes ON to connect the bit line BL1 to the drain electrode D of the memory transistor MT1 and the bit line BLB1 to the drain electrode D of the memory transistor MT2 to read data. Simultaneously, the write select transistor WT11 turns OFF to cut off the connection between the bit line BL1 and the floating gate electrode FG of the memory transistor MT1.

The read and write operations are detailed below. The operation to write the data in the memory cell MC11 included in a memory cell unit MCU11 of the memory apparatus 110 shown in FIG. 16 is explained first. With reference to FIG. 18 through FIG. 22, the operation to write Data "0" in the memory cell MC11 is explained based on the assumption that Data "1" is already stored in the memory cell MC11 before this write data operation starts.

Figure 18:
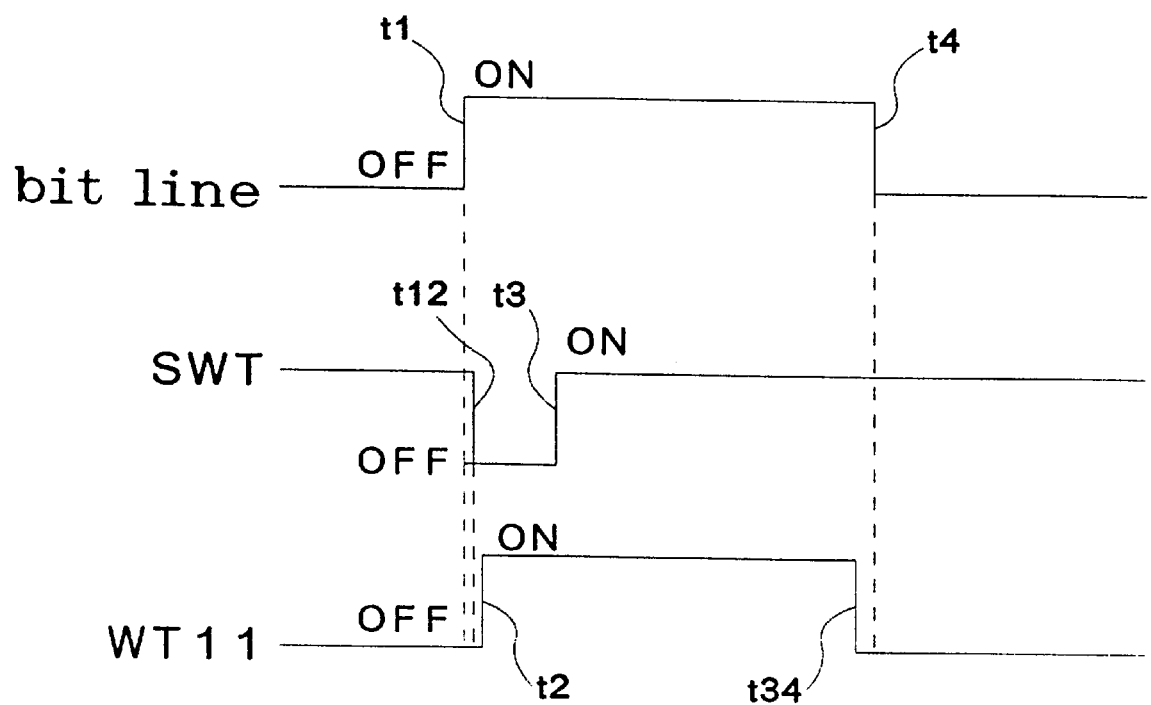
FIG. 18 is a timing diagram for the write operation of the memory apparatus 110.
Figure 19:
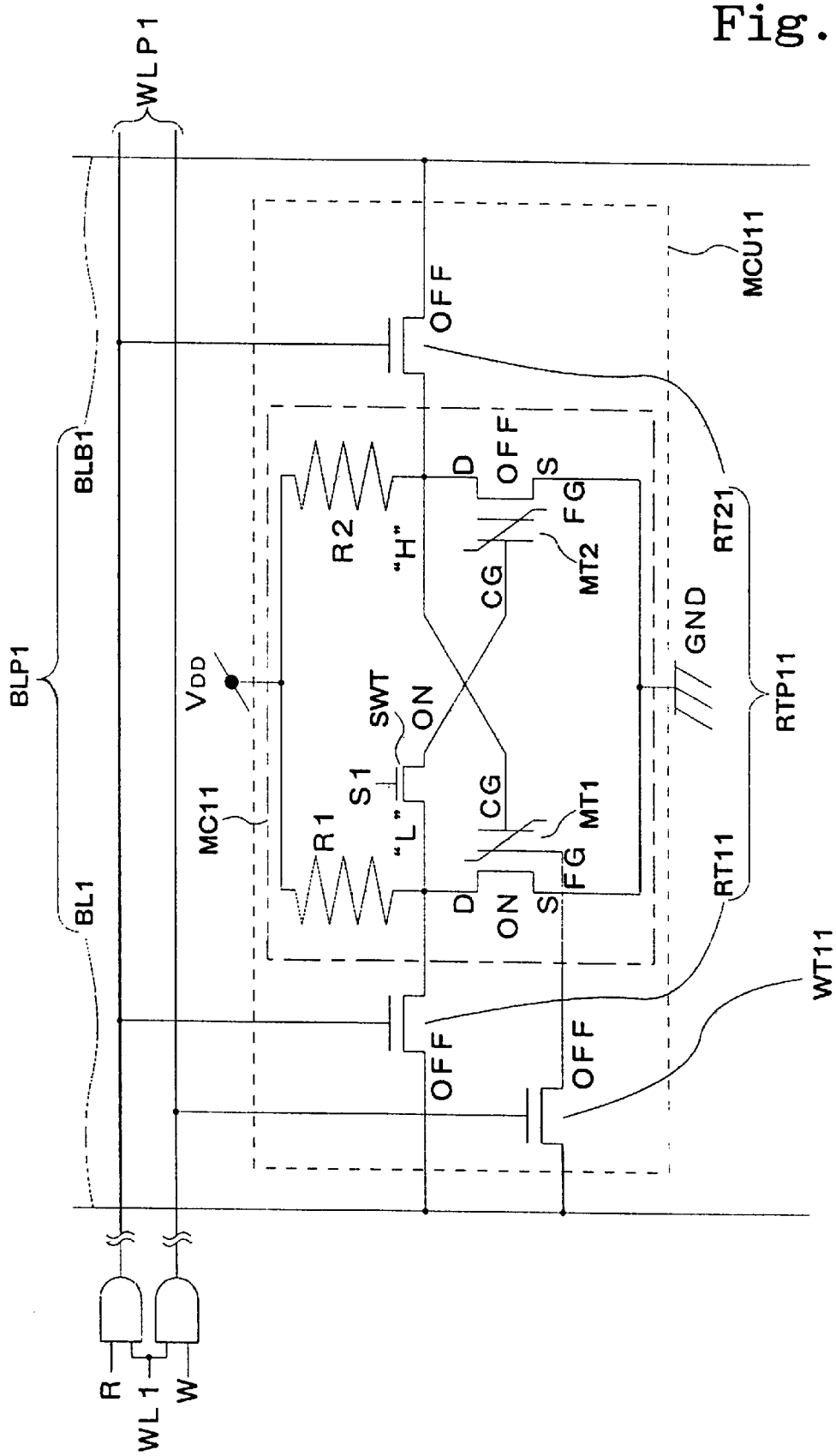
FIG. 19 illustrates a memory cell MC11 of the memory apparatus 110 holding data "1" in a standby state.

FIG. 18 is a timing chart which illustrates whether or not there are outputs by bit lines and how the switching transistor SWT and the write select transistor WT11 operate during the write operation. FIG. 19 explains the state of the memory cell MC11 during a standby period (before the write operation starts). In FIG. 19, the read select transistor pair RTP11 and the write select transistor WT11 are both OFF while the memory transistor MT1 is ON, memory transistor MT2 is OFF, and switching transistor SWT is ON. This is the state when Data "1" is stored. The ON and OFF conditions go through the first step (refer to FIG. 20) and the second step (refer to FIG. 21) to complete the write operation. First, a bit line pair BLP1 is selected by a column decoder 14 and electric potentials that correspond to Data "0" are applied to the bit line pair BLP. In other words, the bit line BL1 of the bit line pair BLP1 is applied with the low electric potential "L" (the ground electric potential) while the bit line BLB1 is applied with the high electric potential "H" (the power source electric potential $V_{DD}$) (refer to FIG. 20). In FIG. 18, a Timing t1 represents the timing of the data output to be written to the bit line pair BLP1.

The switching transistor SWT goes OFF at a timing t12 which immediately follows the timing t1 to start outputting the data to be written. Immediately after that, the write select transistor WT11 goes ON at a timing t2. In other words, the word line WL1 is selected by the line decoder 12 and the word line WL1 and the write control line W are both applied with "H" in electric potential. Consequently, the write select transistor WT11 turns ON.

Figure 20:
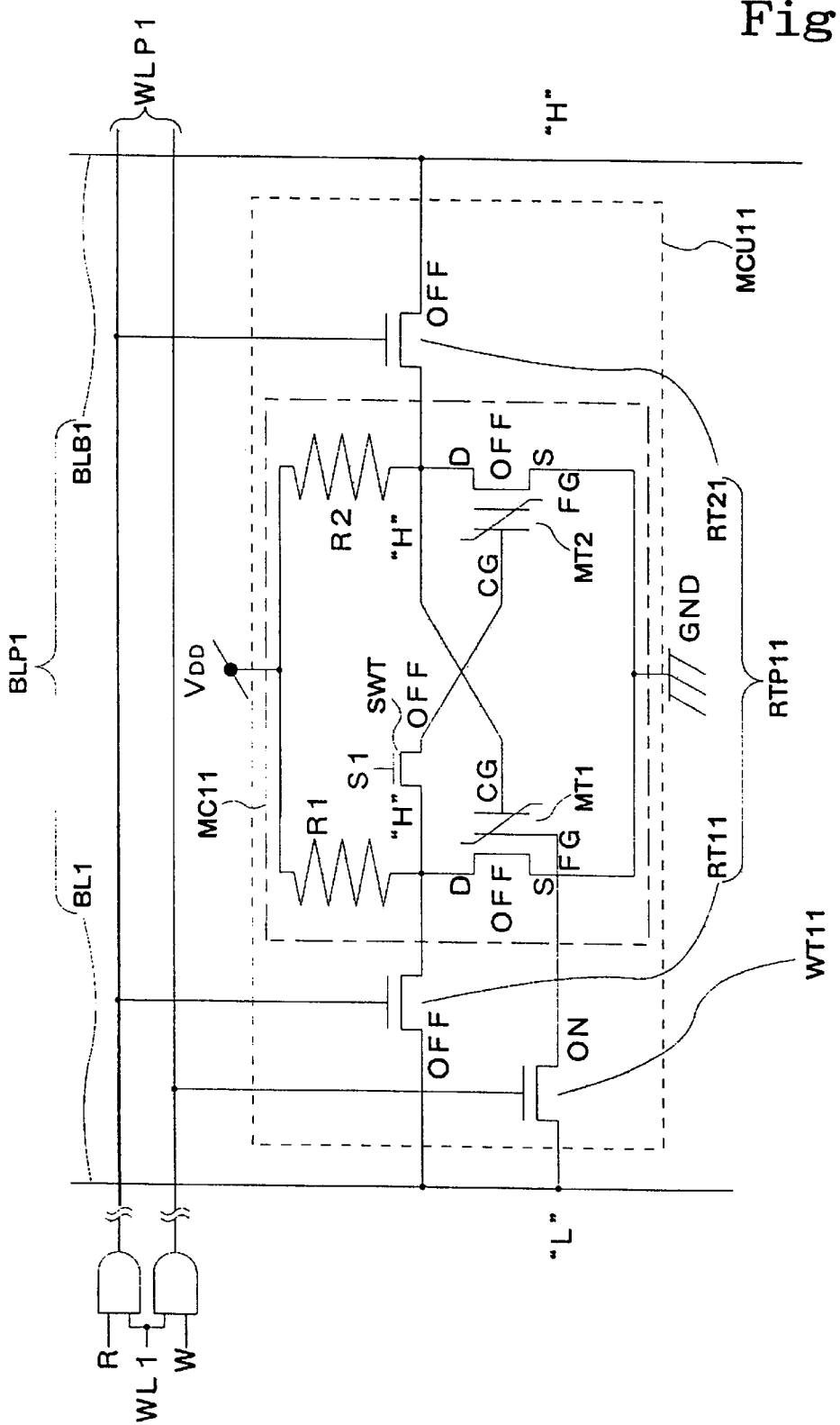
FIG. 20 illustrates a first stage during writing of Data "0" into the memory cell MC11.
Figure 21:
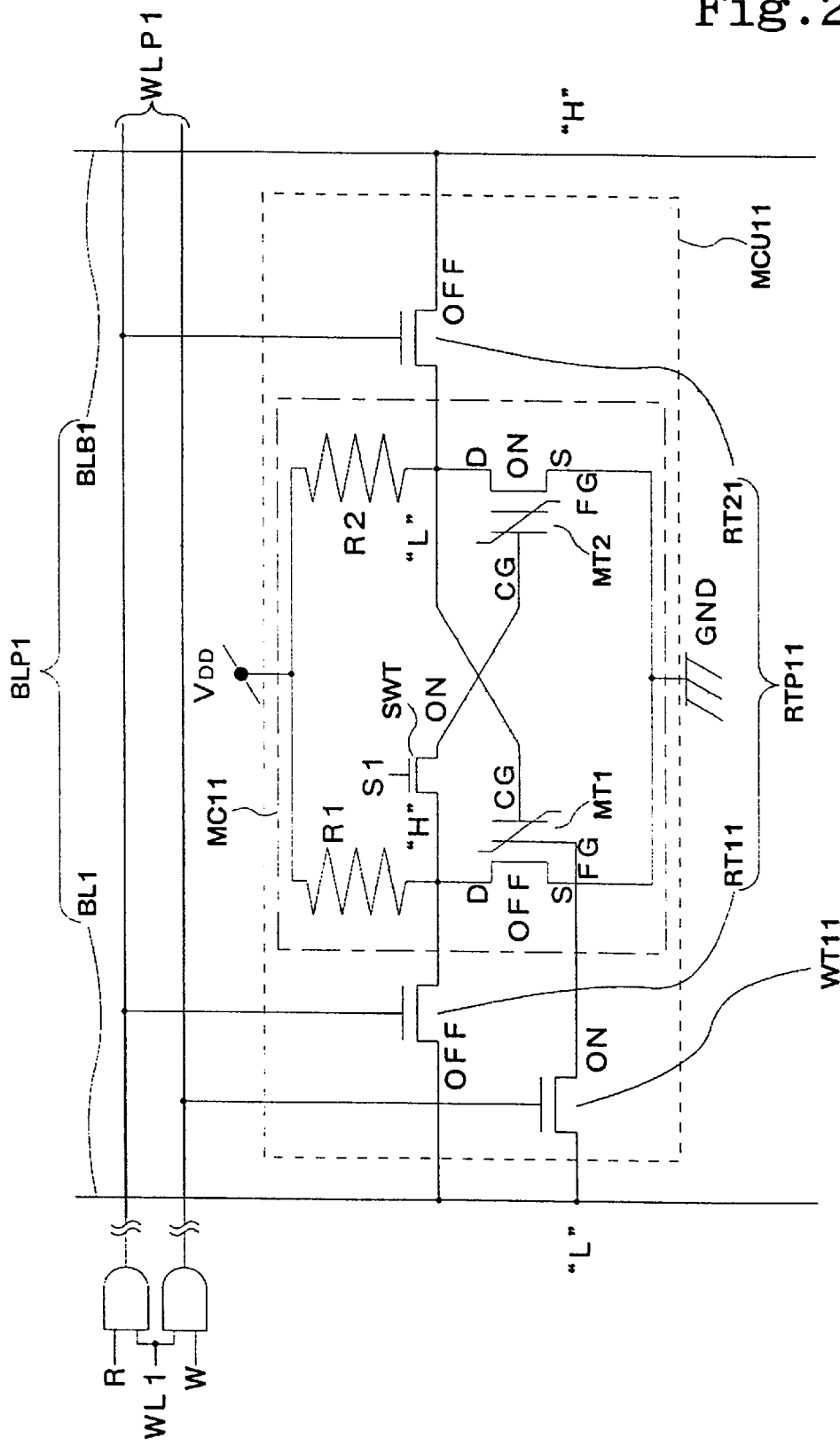
FIG. 21 illustrates a second stage during writing of Data "0" into the memory cell MC11.

Almost simultaneously as the write select transistor pair WTP11 goes ON, the electric potential of a floating gate electrode FG of the memory transistor MT1 in the memory cell MC11 becomes "L" as shown in FIG. 20. Consequently, the memory transistor MT1 goes OFF. Almost simultaneously as the memory transistor MT1 goes OFF, a Drain D of the memory transistor MT1 becomes "H" in electric potential. However, since the switching transistor SWT is OFF, a control gate electrode CG of the memory transistor MT2 is not influenced by the change in the electric potential of the drain electrode D of the memory transistor MT1. In other words, the memory transistor MT2 stays OFF. Consequently, the electric potential of the drain electrode D of the memory transistor MT2 stays "H". Accordingly, the "H" electric potential of the Drain D of the memory transistor MT2 continues to be applied to the control gate electrode CG of the memory transistor MT1. On the other hand, the "L" electric potential is applied to the floating gate electrode FG of the memory transistor MT1 as noted above. The difference in electric potentials of the control gate electrode CG and the floating gate electrode FG triggers the ferroelectric layer 32 of the subject transistor MT1 (refer to FIG. 3A) to inverse its polarization. This state continues from the timing t2 up to the timing t3. The period between the timing t1 and the timing t3 is the first step of the write process. Each timing as noted above is set up to ensure that the ferroelectric layer 32 completely inverses its polarized state between the timing t1 and the timing t3. Consequently, "0" is securely rewritten in the memory transistor MT1 in the first step of the write operation.

Subsequently, the switching transistor SWT goes ON at the timing t3. Almost simultaneously as the switching transistor SWT turns ON, the control gate electrode CG of the memory transistor MT2 is influenced by the electric potential of the drain D of the memory transistor MT1 and becomes "H" in electric potential. When the control gate electrode becomes "H" in electric potential, the memory transistor MT2 goes ON (the relay state). This state continues from the timing t3 up to a timing t34 as shown in FIG. 18. The data output to the bit line pair BLP1 stops at the timing t4 which immediately follows the timing t34 which will be noted later. The period between the timing t3 and the timing t4 is the second step of the write operation.

The difference in electric potentials of the control gate electrode CG and a channel forming area 26 creates a partial pressure between the control gate electrode CG and the floating gate electrode FG (in other words, the ferroelectric layer 32) in the memory transistor MT2. A capacitance between the control gate electrode CG and the floating gate electrode FG and the capacitance between the floating gate electrode FG and the channel forming area 26 are set up to prevent this partial pressure from affecting the ferroelectric layer 32 to inverse its polarized state.

Figure 22:
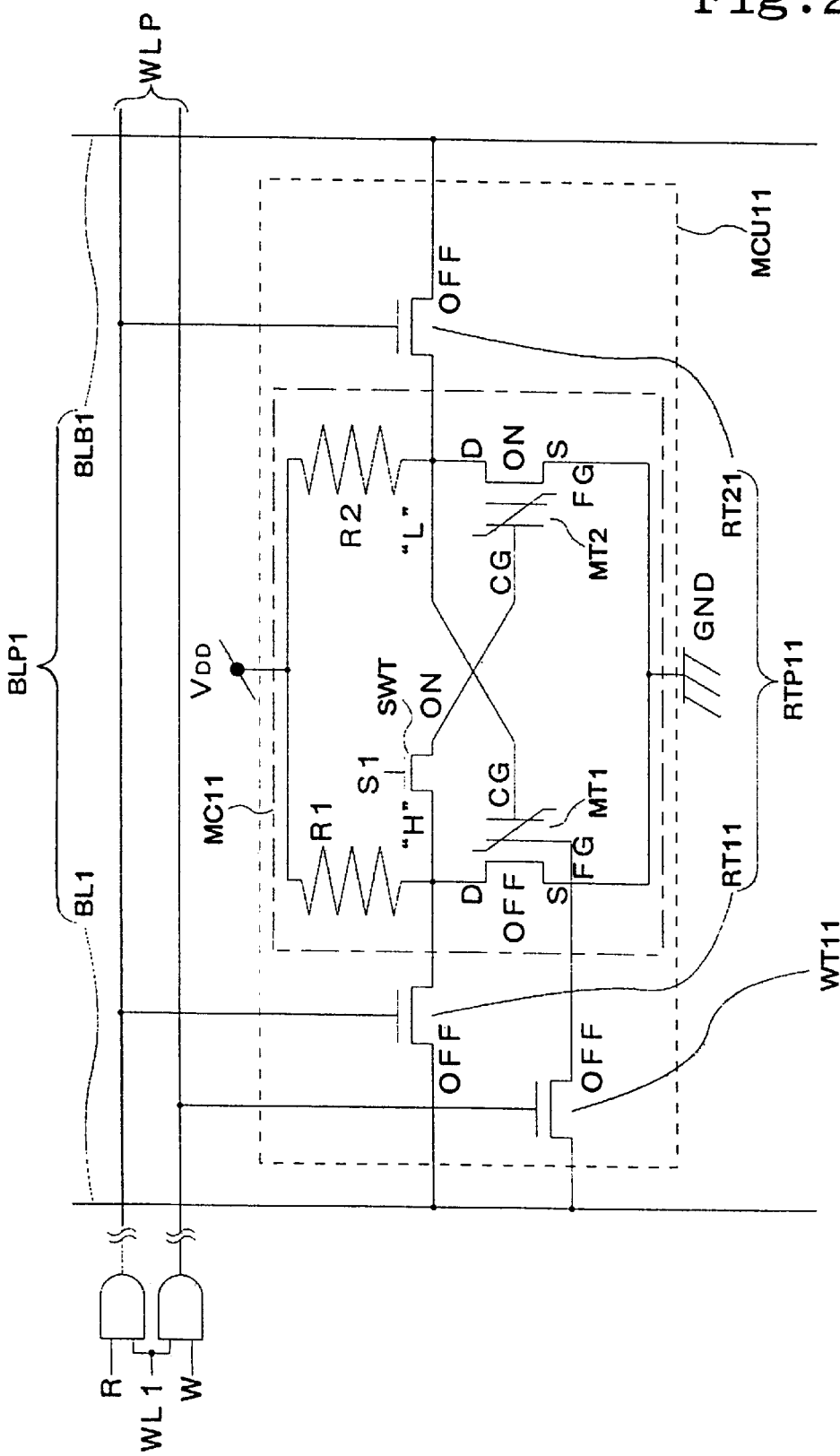
FIG. 22 illustrates a standby state of a memory cell MC11 holding data "0".

Upon completion of above described two (2) steps, contents of the memory cell MC11 are securely rewritten. To end the write operation, the bit line output ends at the timing t4 (refer to FIG. 18) and the write control line W is applied with the "L" electric potential. This results in the write select transistor WT11 to go OFF as shown in FIG. 22. The memory cell MC11 goes into a standby state when the write select transistor WT11 goes OFF.

Even when the memory cell MC11 is in the standby state, the switching transistor SWT stays ON. Consequently, the memory transistor MT1 stays OFF while the memory transistor MT2 stays ON because the memory cell MC11 has a self-latching capability. Therefore, the written Data "0" is retained in the memory cell MC11. The ferroelectric capacitors $C_{ferro}$ of the memory transistor MT1 maintain their respective polarized state even when the power source is cut off. Consequently, the memory transistor MT1 returns to the ON or OFF state that corresponds to the polarized state maintained by the ferroelectric capacitors $C_{ferro}$. Since the switching transistor SWT is set up to go ON when the power source is restored, the memory transistor MT2 also returns to its ON or OFF state before the power source is cut off.

Figure 23:
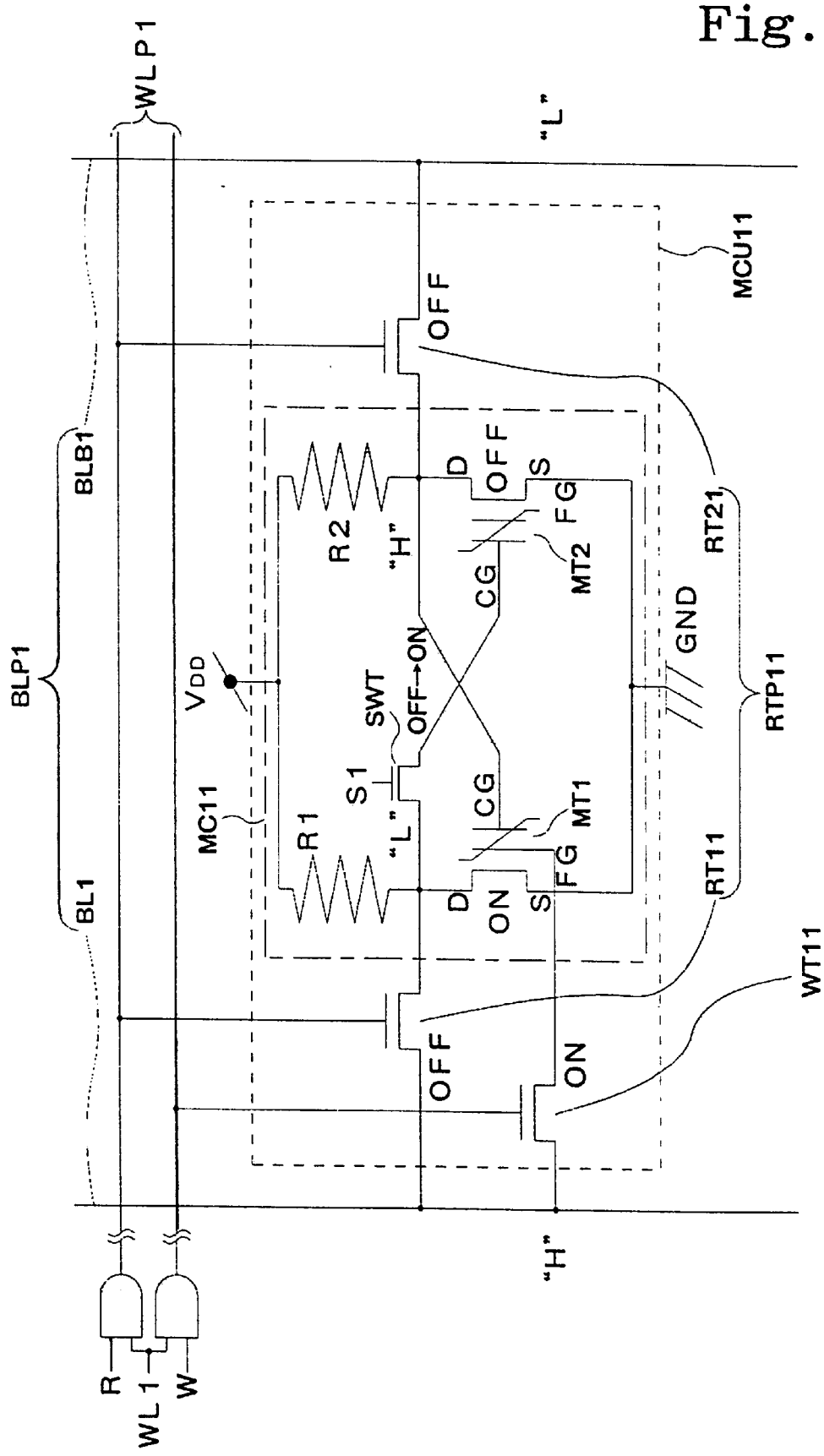
FIG. 23 illustrates writing Data "1" into the memory cell MC11.

The operation to write Data "1" in a memory cell MC11 is explained with reference to FIG. 23. As in the above described write operation of Data "0", this operation is explained on the assumption that Data "1" is stored in the memory cell MC11 prior to the start of this write operation. The state of the memory cell MC11 during the standby period before this write operation is similar to that shown in FIG. 19 to write Data "0". The operation to write Data "1" in the memory cell MC11 is almost identical to the above described operation to write Data "0". However, electric potentials that correspond to Data "1" are applied to a bit line pair BLP1 as indicated in FIG. 23. In other words, the bit line BL1 of the bit line pair BLP1 is applied with the high electric potential "H" (the power source electric potential $V_{DD}$) whereas the bit line BLB1 is applied with the low electric potential "L" (the ground electric potential).

The memory cell in the standby state goes through the first and second steps in accordance with the timing chart of FIG. 18 to complete the write operation similar to the operation described above to write Data "0". To write Data "1", the ferroelectric capacitors $C_{ferro}$ of the memory transistor MT1 maintain their respective polarized state indicated by Q1 in FIG. 10 as in the embodiment in FIG. 2. In other words, this polarized state does not change during the process to write the same data in the memory cell. Moreover, the ferroelectric capacitors $C_{ferro}$ of the memory transistor MT1 stay in their respective polarized state indicated by Q1 in FIG. 10 even when the memory cell is in the standby state.

Figure 24:
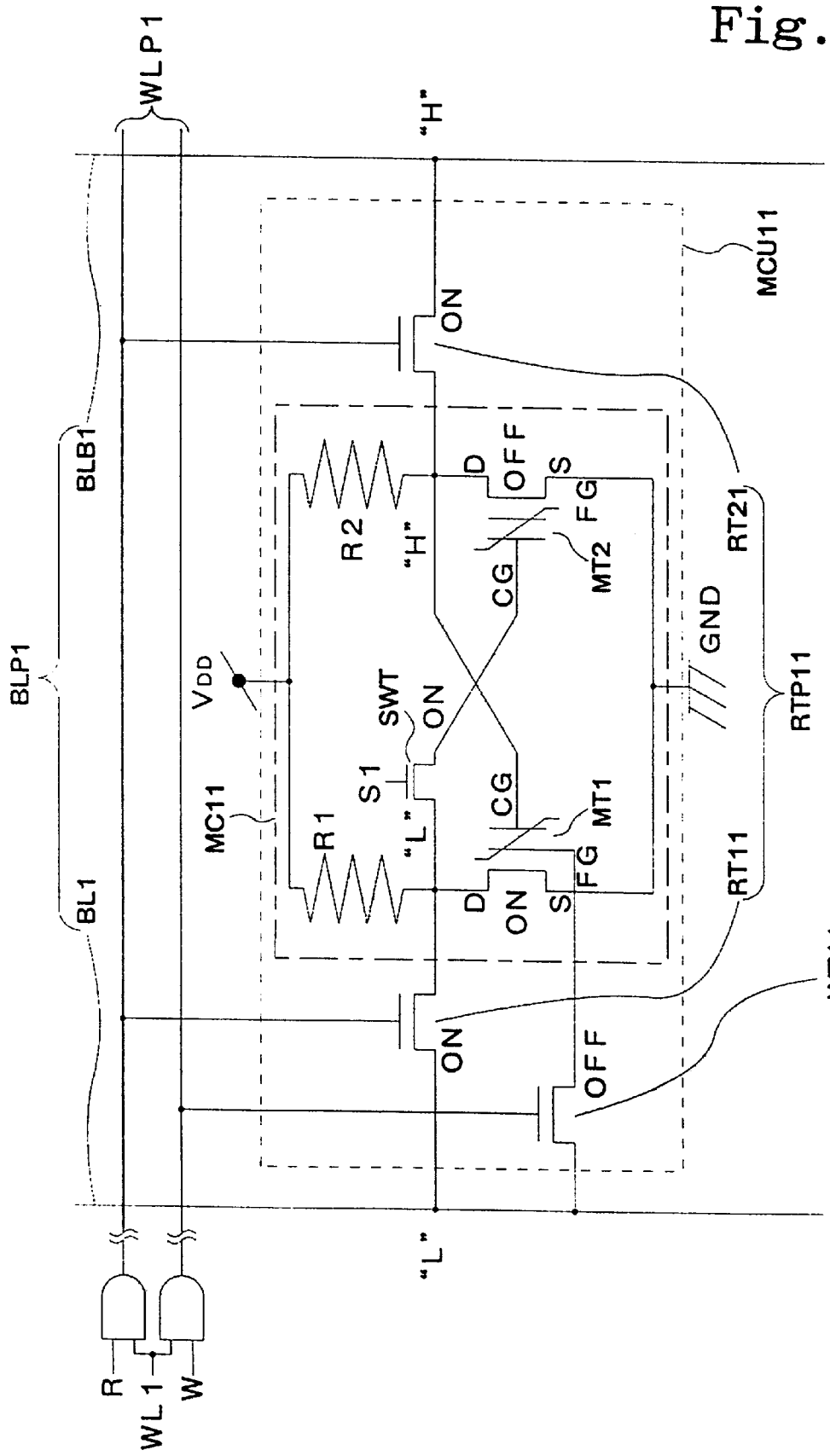
FIG. 24 illustrates reading Data "1" from the memory cell MC11.

The operation to read data from a memory cell MC11 is illustrated in FIG. 24. Since the switching transistor SWT stays ON to read data, the read operation is the same as the embodiment shown in FIG. 2, the explanation hereto is omitted. Similar to the embodiment in FIG. 12, the polarity of the difference in electric potentials of the bit line pair BLP1 to read data and the polarity of the difference in electric potentials of the bit line pair BLP1 to write data are also set up to contrast even for same data in this embodiment.

Although MFMIS structured transistors are used for both memory transistors MT1 and MT2 to form a pair of memory transistors in the memory cell MC11 as an example to explain this embodiment, using the MFMIS structured transistor for only one of the pair of memory transistors MT1 and MT2 and using the regular MOSFET type transistor for the other is also feasible. However, using MFMIS structured transistors for both memory transistors MT1 and MT2 as a pair is preferable since this setup ensures that both transistors conform with one another. In other words, fluctuations in characteristics of a pair of transistors can be minimized because both transistors can be formed during the same production step.

Figure 25:
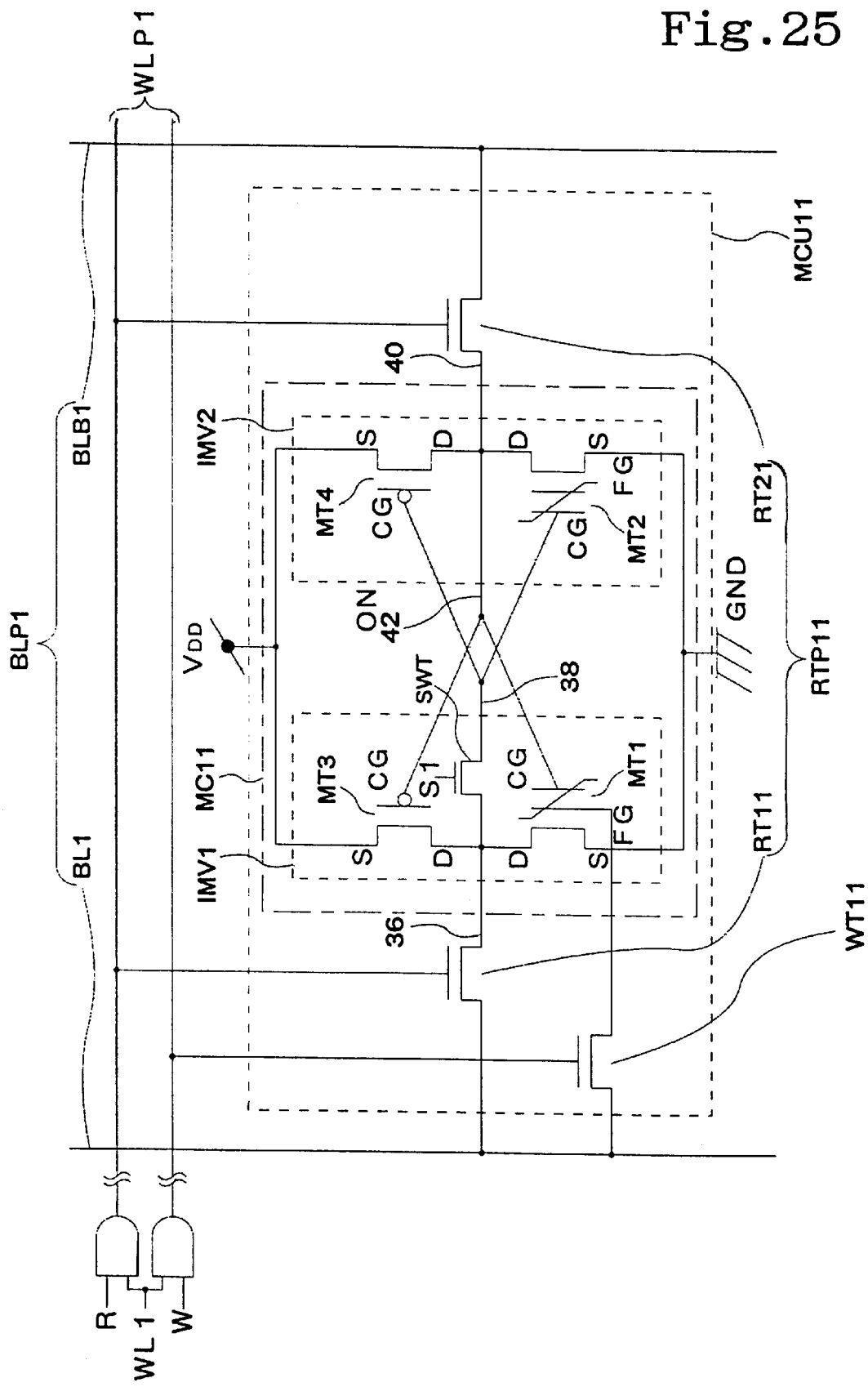
FIG. 25 is a memory cell MC11 included in a memory cell unit MCU11 in accordance with another embodiment of the present invention.

FIG. 25 illustrates another example of specific circuits of a memory cell MC11, a memory element included in a memory cell unit comprising a memory apparatus in accordance with yet another embodiment of the present invention. In this embodiment as in aforementioned embodiments, the memory cell 11 includes a pair of memory transistors MT1, MT2 and another pair of transistors. In this embodiment, memory cell units MCU00, MCU01, and so forth similar to the memory cell unit MCU11 having memory cells including the memory cell MC11 in FIG. 25 are placed in series to form a similar memory apparatus to the memory apparatus 110 shown in FIG. 16.

The memory cell unit MCU11 in FIG. 25 is similar to the memory cell unit MCU11 in FIG. 11, however, with the following differences from the memory cell unit MCU11 in FIG. 11. Similar to the memory cell unit MCU11 in FIG. 17, the floating gate electrode FG of the memory transistor MT2 in the memory cell unit MCU11 in FIG. 25 is not connected to any line. Consequently, this memory cell unit is not provided with the write select transistor WT21. Also in this memory cell unit, an output terminal 36 of an inverter circuit INV1 is connected by a switching transistor SWT to an input terminal 38 of an inverter circuit INV2. In addition, the write operation is divided into the first and second steps (refer to FIG. 18) similarly to the memory cell unit MCU11 in FIG. 17. The rest of the composition is the same as the memory cell unit MCU11 in FIG. 11.

Figure 26:
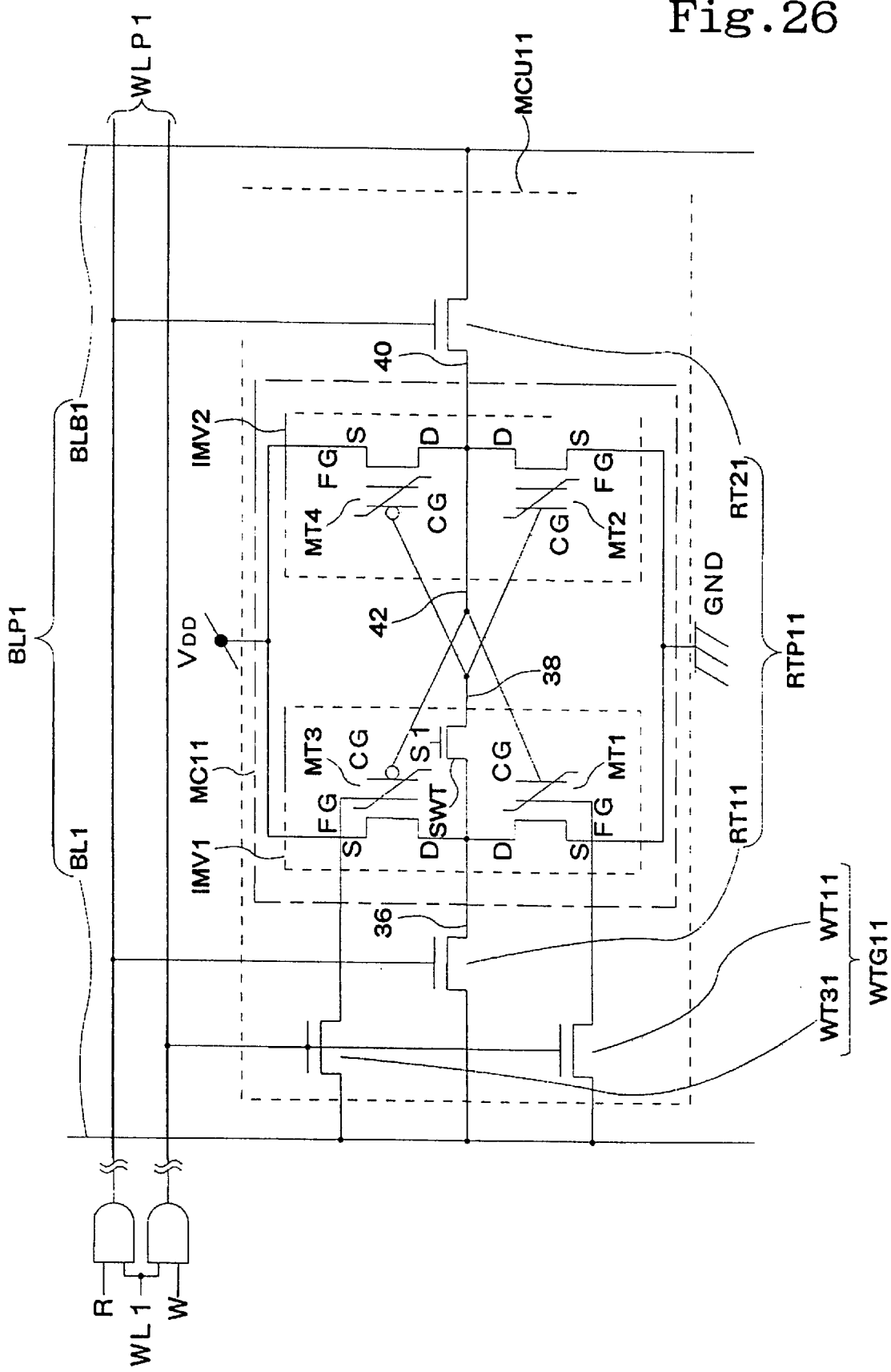
FIG. 26 is a memory cell MC11 included in a memory cell unit MCU11 in accordance with yet another embodiment of the present invention.

Next, another example of a memory cell MC11 included in a memory cell unit MCU11 of a memory apparatus in accordance with yet another embodiment of the present invention is explained. The memory cell unit MCU11 in FIG. 26 is similar to the memory cell unit MCU11 in FIG. 12, however, with the following differences from the memory cell unit MCU11 in FIG. 12. Similar to the memory cell unit MCU11 in FIG. 25, the floating gate electrodes FG of the memory transistors MT2 and MT4 in the memory cell unit MCU11 in FIG. 26 are not connected to any line. Consequently, this memory cell unit is not provided with write select transistors WT21 and WT41. In other words, a write select transistor group WTG11 is comprised of write select transistors WT11 and WT31. Also in the memory cell unit MCU11 in FIG. 26, an output terminal 36 of an inverter circuit INV1 is connected by a switching transistor SWT to an input terminal 38 of an inverter circuit INV2. In addition, the write operation is divided into the first and second steps (refer to FIG. 18) similarly to the memory cell unit MCU11 in FIG. 17. The rest of the composition is the same as the memory cell unit MCU11 in FIG. 12.

Figure 27:
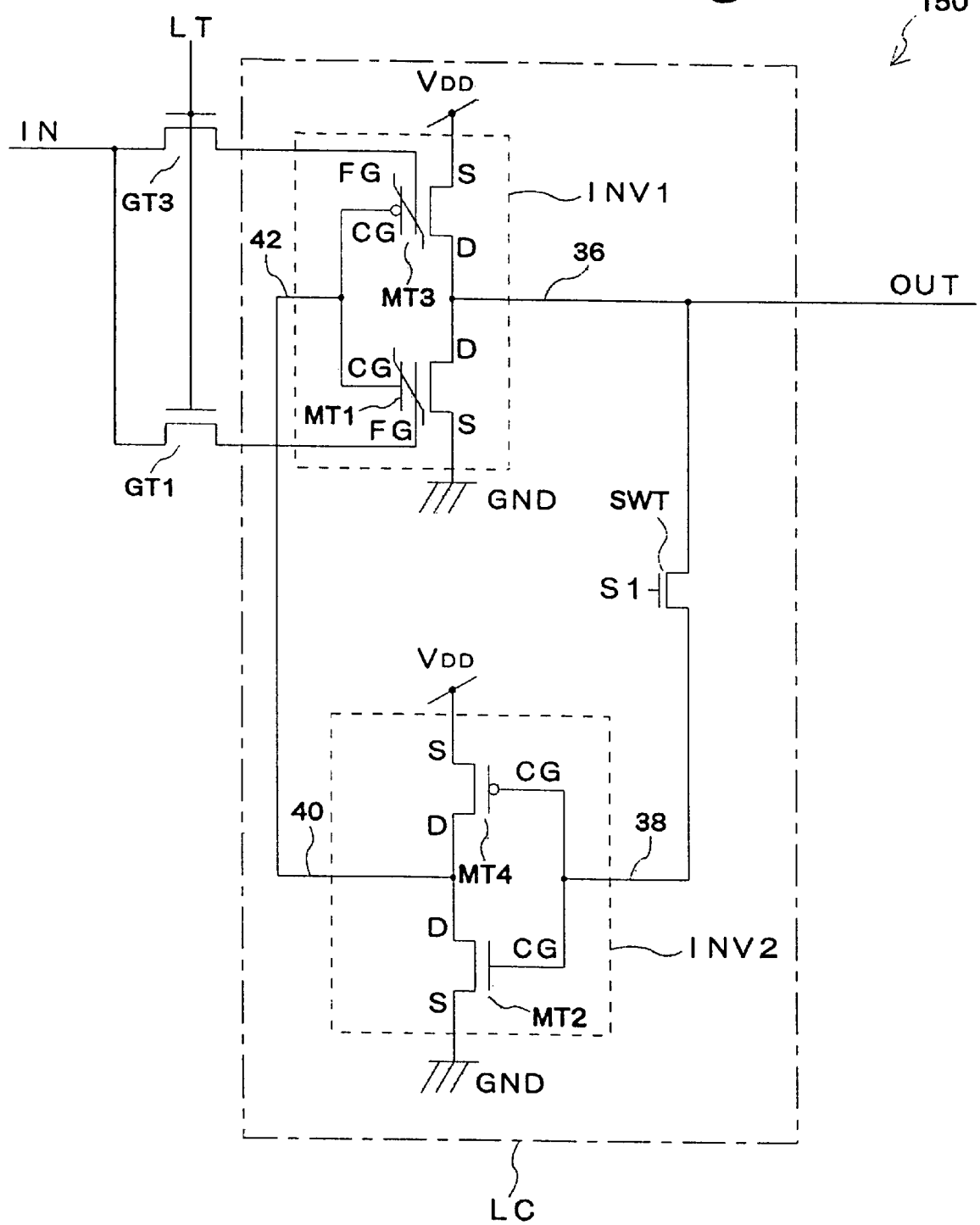
FIG. 27 is a latch circuit 150 for a memory apparatus in accordance with yet another embodiment of the present invention.
Figure 28:
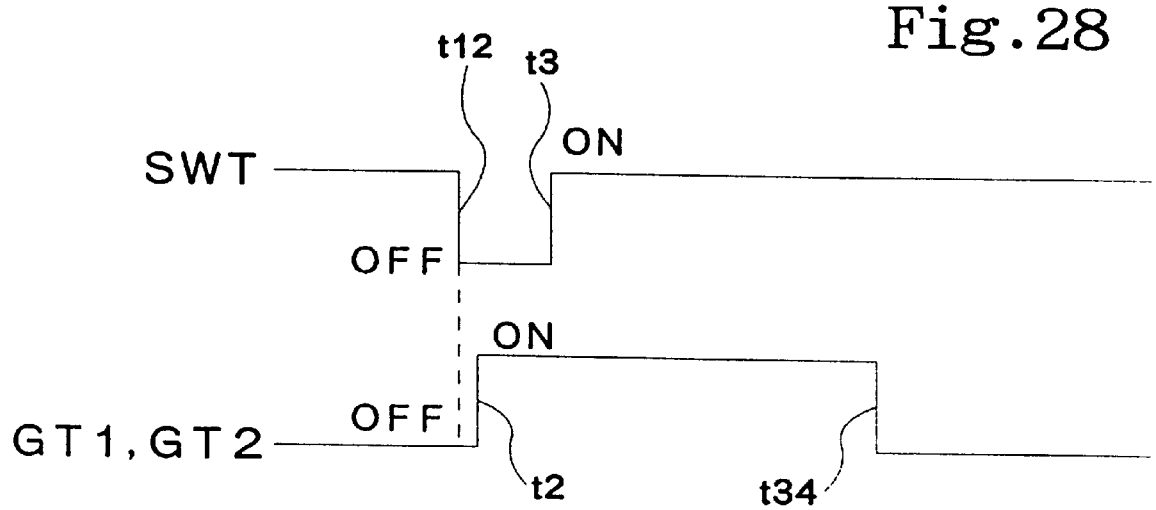
FIG. 28 is a timing diagram for an operation to refresh data in the latch circuit 150.

A latch circuit 150, a data holding apparatus, in accordance with yet another embodiment of the present invention is explained with reference to FIG. 27. The latch circuit 150 is similar to the latch circuit 50 in FIG. 13, however, with following differences from the latch circuit 50 in FIG. 13. The latch circuit 150 in FIG. 27 is similar to the memory cell unit MCU11 in FIG. 25 in that an output terminal 36 of its inverter circuit INV1 is connected by a switching transistor SWT to an input terminal 38 of its inverter circuit INV2. In addition, the data refresh operation is similar to the write operation of the memory cell unit MCU11 in FIG. 17 and divided into the first and second steps. FIG. 28 is a timing chart illustrating the operations of the switching transistor SWT and gate transistors GT1 and GT3 to refresh data. As illustrated in FIG. 28, the data refresh operation similar to the write operation of the memory cell unit MCU11 in FIG. 17 is divided into the first step (from the timing t12 to t3 in FIG. 28) and the second step (from the timing t3 to t34 in FIG. 28) to ensure that data is securely refreshed. The rest of its composition/configuration is the same as the latch circuit 50.

Figure 29:
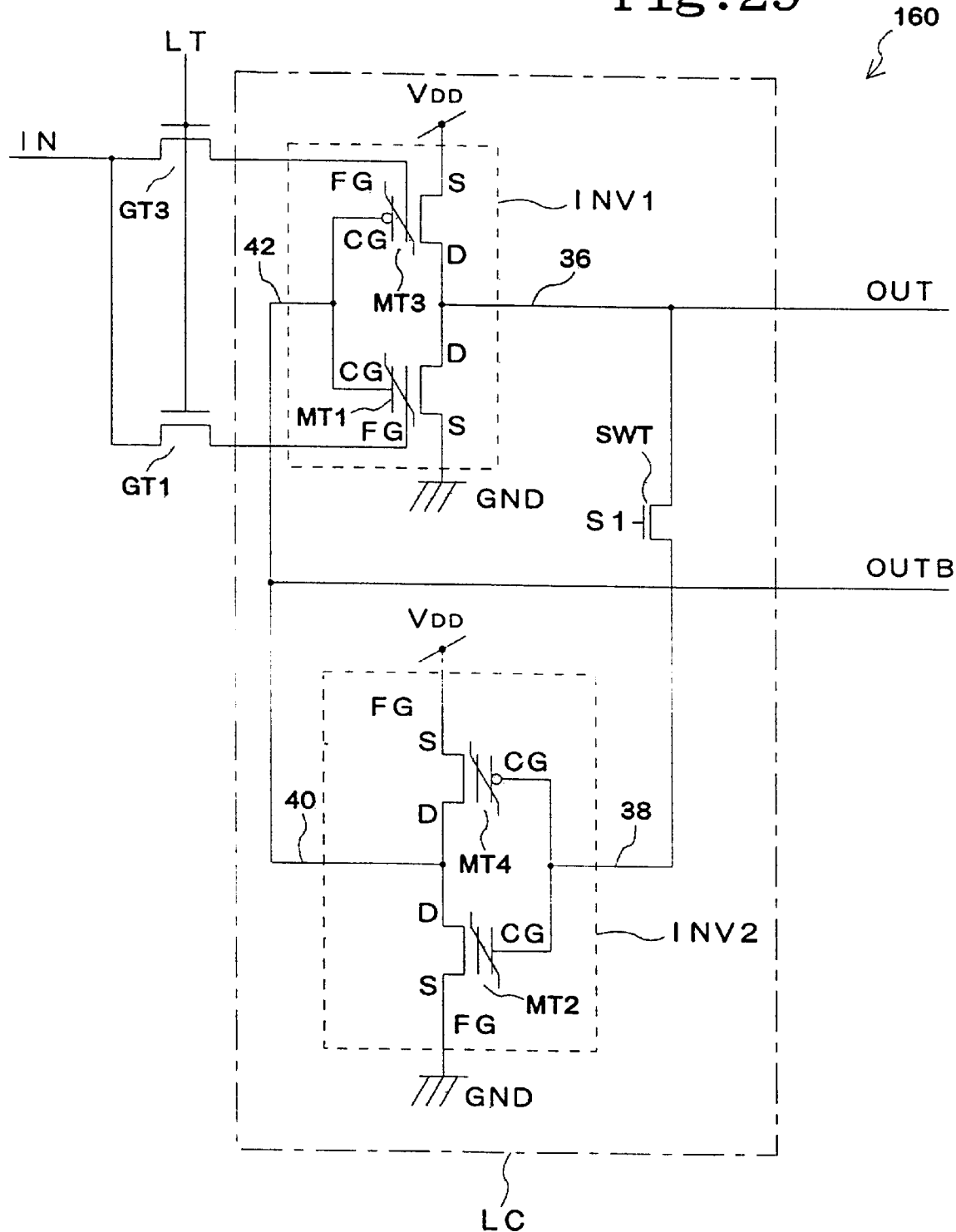
FIG. 29 is a latch circuit 160 for a memory apparatus in accordance with yet another embodiment of the present invention.

A latch circuit 160, a data holding apparatus, in accordance with yet another embodiment of the present invention is explained with reference to FIG. 29. The latch circuit 160 is comprised similarly to the latch circuit 60 in FIG. 14, however, with following differences from the latch circuit 60 in FIG. 14. The floating gate electrodes FG of the memory transistors MT2 and MT4 in the latch circuit 160 are not connected to any line. As a result, this latch circuit is not provided with gate transistors GT2 and GT4 and an input line INB. In the latch circuit 160 shown in FIG. 29 similar to the latch circuit 150 in FIG. 27, an output terminal 36 of its inverter circuit INV1 is connected by a switching transistor SWT to an input terminal 38 of its inverter circuit INV2. In addition, the data refresh operation is divided into the first and second steps similar to the latch circuit 150 in FIG. 27. The rest of the composition/configuration is the same as the latch circuit 60 in FIG. 14.

In all embodiments explained above in reference to FIG. 16 through FIG. 29, the positive feedback signal path is provided with the switching transistor SWT in order to hold data. Moreover, the voltage corresponding to data to be written (or refreshed) is applied directly to the floating gate electrode FG of the memory transistor MT1 (or those of MT1 and MT3) to write (or refresh) data. The above noted composition ensures that a ferroelectric layer 32 of a memory transistor MT1 (or those of MT1 and MT3) is in a polarized state that corresponds to data to be written (or to be refreshed). Subsequently turning ON the subject switching transistor SWT enables a memory transistor MT2 (or MT2 and MT4) to be in a ON or OFF state opposite from that of the memory transistor MT1 (or MT1 and MT3). Consequently, the data holding apparatus of the present invention can write (refresh) data reliably regardless of fluctuations in steps to manufacture these transistors.

Although an n-channel MOSFET type transistor was used as a switching element in all of the above described embodiments, the switching element is not limited to this type of a transistor. For example, a p-channel MOSFET type transistor or a transmission gate can also be used as a switching element. Furthermore, a variety of modified examples used in all embodiments explained in reference to FIG. 1 through FIG. 14 are also applicable to all embodiments explained in reference to FIG. 16 through FIG. 29.

Although memory apparatuses and latch circuits used as examples in all embodiments to explain the data holding apparatus of the present invention, the definition of the data holding apparatus of the present invention is not limited to memory apparatuses and latch circuits but includes all apparatuses and circuits that hold data.

It will be apparent to those skilled in the art that various modifications and variations can be made of the present invention without departing from the spirit or scope of the inventions. Thus, it is intended that the present invention cover modifications and variations of this invention that come within the scope of the appended claims and their equivalents.

What is claimed is:

1. A data holding apparatus comprising a plurality of semiconductor memory cells, each memory cell comprising first and second transistors each having a source area, a drain area, a channel forming area between the source area and the drain area, a gate insulating film over the channel forming area, and a control gate over the gate insulating film, wherein at least the first transistor is a ferroelectric transistor having a floating gate over the gate insulating film, and a ferroelectric layer between the floating gate and the control gate, wherein each of the first and second transistors provides a positive feedback to the other of the first and second transistors to maintain an ON or OFF state of the other transistor, and wherein the memory cell holds data defined by the ON or OFF states of the first and second transistors.

2. The data holding apparatus of claim 1, wherein the control gate of the first transistor is connected to the drain of the second transistor and the control gate of the second transistor is connected to the drain of the first transistor to provide a positive feedback to each other, and the ON or OFF states of the first and second transistors are opposite to each other.

3. The data holding apparatus of claim 2, further comprising a first power source supply line, a second power source supply line, and data lines carrying data signals to be written into or read from the memory cell, wherein the drains of the first and second transistors are connected to the first power source supply line via a first and a second pull-up line, respectively, and the sources of the first and second transistors are connected to the second power source supply line, wherein when writing data, the data lines are connected to the floating gate of the first transistor and disconnected from the drains of the first and second transistors, and wherein when reading data, the data lines are connected to the drains of the first and second transistors and disconnected from the floating gate of the first transistor.

4. The data holding apparatus of claim 3, wherein the first and second transistors are ferroelectric transistors each having a floating gate over the gate insulating film, and a ferroelectric layer between the floating gate and the control gate, wherein the data holding apparatus comprises first and second data lines carrying opposite logical values, wherein when writing data, the first and second data lines are connected to the floating gates of the first and second transistors, respectively, and disconnected from the drains of the first and second transistors, respectively, and wherein when reading data, the first and second data lines are connected to the drains of the first and second transistors, respectively, and disconnected from the floating gates of the first and second transistors, respectively.

5. The data holding apparatus of claim 1 further comprising third and fourth transistors each having a source area, a drain area, a channel forming area between the source area and the drain area, a gate insulating film over the channel forming area, and a control gate over the gate insulating film, the first and third transistors forming a first inverter and the second and fourth transistors forming a second inverter, wherein at least the first transistor is a ferroelectric transistor having a floating gate over the gate insulating film, and a ferroelectric layer between the floating gate, and wherein an output terminal of the first inverter is connected to an input terminal of the second inverter and an output terminal of the second inverter is connected to an input terminal of the first inverter to provide a positive feedback to each other, and wherein output states of the first and second transistors are opposite to each other.

6. The data holding apparatus of claim 5, further comprising data lines carrying data signals to be written into or read from the memory cell, wherein when writing data, the data line is connected to the floating gate of the first transistor and disconnected from the output terminals of the first and second inverters, and wherein when reading data, the data line is connected to the output terminals of the first and second inverters and disconnected from the floating gate of the first transistor.

7. The data holding apparatus of claim 6, wherein the first and second transistors are ferroelectric transistors each having a floating gate over the gate insulating film, and a ferroelectric layer between the floating gate and the control gate, wherein the data holding apparatus comprises first and second data lines carrying opposite logical values, wherein when writing data, the first and second data lines are connected to the floating gate of the first and second transistors, respectively, and disconnected from the output terminals of the first and second inverters, respectively, and wherein when reading data, the first and second data lines are connected to the output terminals of the first and second inverters, respectively, and disconnected from the floating gates of the first and second transistors, respectively.

8. The data holding apparatus of claim 7, wherein the third and fourth transistors are ferroelectric transistors each having a floating gate over the gate insulating film, and a ferroelectric layer between the floating gate and the control gate, wherein when writing data, the first and second data lines are connected to the floating gate of the third and fourth transistors, respectively, and wherein when reading data, the first and second data lines are disconnected from the floating gates of the third and fourth transistors, respectively.

9. The data holding apparatus of claim 5, further comprising an input line on a data input side and an output line on a data output side, wherein the input line is connected to the floating gates when refreshing data and disconnected from the floating gates when holding data, and wherein the output line is connected to the output terminals.

10. The data holding apparatus of claim 9, wherein the first and third transistors are ferroelectric transistors each having a floating gate over the gate insulating film, and a ferroelectric layer between the floating gate and the control gate, wherein the input line is connected to the floating gates of the first and third transistors when refreshing data and disconnected from the floating gates of the first and third transistors when holding data, and wherein the output line is connected to the output terminal of the first or the second inverter.

11. The data holding apparatus of claim 10, wherein second and fourth transistors are ferroelectric transistors each having a floating gate over the gate insulating film, and a ferroelectric layer between the floating gate and the control gate, wherein the data holding apparatus comprises first and second data lines being carrying opposite logical values and first and second output lines carrying opposite logical values, wherein when refreshing data, the first input line is connected to the floating gates of the first and the third transistors, and the second input line is connected to the floating gates of the second and the fourth transistors, wherein when holding data, the first input line is disconnected from the floating gates of the first and the third transistors, and the second input line is connected to the floating gates of the second and the fourth transistors, and wherein the first and second output lines are connected to the output terminals of the first and second inverters, respectively.

12. The data holding apparatus of claim 1, further comprising a pair of electric source supply lines carrying opposite electric potentials and a bus line, wherein the source and the control gate of the first transistor are connected to one of the pair of the electric source supply lines and the drain of the first transistor is connected to the bus line, wherein the memory cell further comprises a third transistor having a source area, a drain area, a channel forming area between the source area and the drain area, a gate insulating film over the channel forming area, and a control gate over the gate insulating film, the second and third transistors forming an inverter, an input terminal of the inverter being connected to the bus line and an output terminal of the inverter being connected to the floating gate of the first transistor.

13. The data holding apparatus of claim 1, wherein the control gate of the first transistor is directly connected to the drain of the second transistor and the control gate of the second transistor is connected via a switching element to the drain of the first transistor, and wherein when writing data, the switching element is turned OFF for a predetermined time period, a voltage representing the data to be written is directly applied to the floating gate of the first transistor while the switching element is OFF, and the switching element is subsequently turned ON.

14. The data holding apparatus of claim 5, wherein the output terminal of the second inverter is directly connected to the input terminal of the first inverter, and the output terminal of the first inverter is connected via a switching element to the input terminal of the second inverter, and wherein when writing data, the switching element is turned OFF for a predetermined time period, a voltage representing the data to be written is directly applied to the floating gate of the first transistor while the switching element is OFF, and the switching element is subsequently turned ON.

15. A method for operating a semiconductor memory cell to write and read data, the memory cell comprising first and second transistors, a control gate of the first transistor being connected to a drain of the second transistor and a control gate of the second transistor being connected to a drain of the first transistor, at least the first transistor being ferroelectric transistor having a floating gate over the gate insulating film, and a ferroelectric layer between a gate insulating film and a control gate, the method comprising:

when writing data, connecting data lines to the floating gate of the first transistor and disconnecting the data lines from the drains of the first and second transistors, and when reading data, connecting the data lines to the drains of the first and second transistors and disconnecting the data lines from the floating gate of the first transistor.

16. A method for operating a semiconductor memory cell to write and read data, the memory cell comprising first and second transistors, a control gate of the first transistor being connected to a drain of the second transistor and a control gate of the second transistor being connected to a drain of the first transistor via a switching element, at least the first transistor being ferroelectric transistor having a floating gate over the gate insulating film, and a ferroelectric layer between a gate insulating film and a control gate, the method comprising:

when writing data, turning the switching element OFF for a predetermined time period, directly applying a voltage representing the data to be written to the floating gate of the first transistor while the switching element is OFF, and then turning the switching element ON.

* * * * *